US011353158B2

(12) United States Patent
Raghupathy et al.

(10) Patent No.: US 11,353,158 B2
(45) Date of Patent: Jun. 7, 2022

(54) COMPACT ELECTRONIC DEVICE WITH THERMAL MANAGEMENT

(71) Applicant: Google LLC, Mountain View, CA (US)

(72) Inventors: Arun Raghupathy, Pleasanton, CA (US); Benjamin Niewood, San Francisco, CA (US); Cheng-Jung Lee, San Jose, CA (US); Adam Scott Kilgore, San Rafael, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/328,501

(22) Filed: May 24, 2021

(65) Prior Publication Data

US 2021/0278030 A1    Sep. 9, 2021

Related U.S. Application Data

(63) Continuation of application No. 16/903,049, filed on Jun. 16, 2020, now Pat. No. 11,035,517, which is a
(Continued)

(51) Int. Cl.
*H04N 5/225* (2006.01)
*F16M 11/20* (2006.01)
(Continued)

(52) U.S. Cl.
CPC ....... *F16M 11/2035* (2013.01); *F16M 11/105* (2013.01); *F16M 11/14* (2013.01);
(Continued)

(58) Field of Classification Search
CPC .................................................. H04N 5/2254
(Continued)

(56) References Cited

U.S. PATENT DOCUMENTS 1,483,588 A    2/1924   Meyers et al.
1,945,956 A    2/1934   Rowell
(Continued)

FOREIGN PATENT DOCUMENTS

CN    201203743    3/2009
CN    201657126    11/2010
(Continued)

OTHER PUBLICATIONS

"Advisory Action", U.S. Appl. No. 15/608,904, dated May 18, 2020, 3 pages.
(Continued)

*Primary Examiner* — Anthony J Daniels
(74) *Attorney, Agent, or Firm* — Colby Nipper PLLC

(57) ABSTRACT

This application is directed to a passively-cooled electronic device including a housing, a plurality of electronic assemblies and a plurality of thermally conductive parts. The electronic assemblies are enclosed in the housing, and include a first electronic assembly and a second electronic assembly. The first and second electronic assemblies are disposed proximately to each other within the housing, and the second electronic assembly is substantially sensitive to heat, including heat generated by operation of the first electronic assembly. The thermally conductive parts are coupled between the first electronic assembly and the housing, and configured to create a first plurality of heat conduction paths to conduct the heat generated by the first electronic assembly away from the second electronic assembly without using a fan. At least a subset of the thermally conductive parts mechanically supports one or both of the first and second electronic assemblies.

20 Claims, 10 Drawing Sheets

Related U.S. Application Data continuation of application No. 15/607,387, filed on May 26, 2017, now Pat. No. 10,683,962.

(60) Provisional application No. 62/511,302, filed on May 25, 2017.

(51) Int. Cl.
*F16M 13/00* (2006.01)
*F16M 11/10* (2006.01)
*F16M 13/02* (2006.01)
*F16M 11/14* (2006.01)
*G03B 17/08* (2021.01)
*G03B 17/55* (2021.01)
*H04N 7/18* (2006.01)
*H05K 7/20* (2006.01)
*F16M 11/04* (2006.01)
*F16M 11/06* (2006.01)
*A47B 97/00* (2006.01)
*G03B 17/56* (2021.01)
*F21V 21/30* (2006.01)
*F21V 21/088* (2006.01)
*F16M 11/38* (2006.01)

(52) U.S. Cl.
CPC .......... *F16M 13/00* (2013.01); *F16M 13/005* (2013.01); *F16M 13/02* (2013.01); *F16M 13/022* (2013.01); *G03B 17/08* (2013.01); *G03B 17/55* (2013.01); *H04N 5/2252* (2013.01); *H04N 7/181* (2013.01); *H05K 7/20445* (2013.01); *A47B 2097/003* (2013.01); *F16M 11/041* (2013.01); *F16M 11/06* (2013.01); *F16M 11/2007* (2013.01); *F16M 11/2064* (2013.01); *F16M 11/38* (2013.01); *F21V 21/088* (2013.01); *F21V 21/30* (2013.01); *G03B 17/561* (2013.01); *H04N 5/2254* (2013.01)

(58) Field of Classification Search
USPC .................................................. 348/373, 374
See application file for complete search history.

(56) References Cited

U.S. PATENT DOCUMENTS

| | | |
|---|---|---|
| 2,645,511 A | 7/1953 | Rutledge |
| 2,734,997 A | 2/1956 | Frady |
| 3,733,042 A | 5/1973 | Junjohann et al. |
| 3,748,383 A | 7/1973 | Grossman |
| 4,904,148 A | 2/1990 | Larsson |
| 5,437,207 A | 8/1995 | Zimmer |
| 5,464,178 A | 11/1995 | Grinwald et al. |
| 5,497,306 A | 3/1996 | Pastrick |
| 5,508,740 A * | 4/1996 | Miyaguchi ......... H04N 5/22521 348/244 |
| 5,625,410 A | 4/1997 | Washino et al. |
| 5,765,485 A | 6/1998 | Thoman et al. |
| D403,313 S | 12/1998 | Peppel |
| 6,018,414 A | 1/2000 | Chipper |
| 6,020,994 A | 2/2000 | Cook |
| D424,036 S | 5/2000 | Arora et al. |
| 6,250,174 B1 | 6/2001 | Terada et al. |
| D456,293 S | 4/2002 | Tsumura et al. |
| 6,585,201 B1 | 7/2003 | Reed |
| 6,593,956 B1 | 7/2003 | Potts et al. |
| D488,818 S | 4/2004 | Lee et al. |
| D500,047 S | 12/2004 | Sevedermish |
| 6,948,131 B1 | 9/2005 | Neven et al. |
| 6,954,498 B1 | 10/2005 | Lipton |
| D550,227 S | 9/2007 | Sato et al. |
| 7,382,244 B1 | 6/2008 | Donovan et al. |
| D590,416 S | 4/2009 | Kochackis |
| D597,864 S | 8/2009 | Sakuma et al. |
| D607,004 S | 12/2009 | Kordus et al. |
| D619,612 S | 7/2010 | Pueyo et al. |
| D621,730 S | 8/2010 | Driver et al. |
| D626,131 S | 10/2010 | Kruzeniski et al. |
| 7,877,708 B2 | 1/2011 | Zinn et al. |
| 7,884,855 B2 | 2/2011 | Ortiz |
| 7,903,115 B2 | 3/2011 | Platzer et al. |
| 7,996,771 B2 | 8/2011 | Girgensohn |
| D647,809 S | 11/2011 | Driver |
| D656,157 S | 3/2012 | Khan et al. |
| D658,674 S | 5/2012 | Shallcross et al. |
| 8,184,069 B1 | 5/2012 | Rhodes |
| 8,188,432 B1 | 5/2012 | Nguyen et al. |
| D661,701 S | 6/2012 | Brown et al. |
| D662,508 S | 6/2012 | Kim |
| D664,966 S | 8/2012 | Shallcross et al. |
| D664,978 S | 8/2012 | Tanghe et al. |
| D672,364 S | 12/2012 | Reyna et al. |
| 8,340,654 B2 | 12/2012 | Bratton et al. |
| D677,269 S | 3/2013 | Scott et al. |
| D678,898 S | 3/2013 | Walsh et al. |
| 8,390,684 B2 | 3/2013 | Piran et al. |
| D681,653 S | 5/2013 | Bitran et al. |
| D681,660 S | 5/2013 | Matas |
| D684,164 S | 6/2013 | Friedlander et al. |
| D686,221 S | 7/2013 | Brinda et al. |
| D686,635 S | 7/2013 | Cranfill et al. |
| D689,892 S | 9/2013 | Perry et al. |
| D689,895 S | 9/2013 | DeLuca |
| D692,450 S | 10/2013 | Convay et al. |
| D694,255 S | 11/2013 | Jones, Jr. |
| 8,589,374 B2 | 11/2013 | Chaudhri |
| D696,677 S | 12/2013 | Corcoran et al. |
| 8,615,511 B2 | 12/2013 | Jones |
| D697,930 S | 1/2014 | Crabtree et al. |
| D697,940 S | 1/2014 | Bitran et al. |
| 8,665,375 B2 | 3/2014 | Moore et al. |
| D702,700 S | 4/2014 | Thomspon |
| D702,704 S | 4/2014 | Santos et al. |
| D705,255 S | 5/2014 | Gerssen et al. |
| 8,720,296 B2 | 5/2014 | Yonehara et al. |
| D707,245 S | 6/2014 | Bruck et al. |
| D708,197 S | 7/2014 | Pasceri et al. |
| D708,204 S | 7/2014 | Pasceri et al. |
| D711,415 S | 8/2014 | Simister et al. |
| D712,928 S | 9/2014 | Brener et al. |
| D714,334 S | 9/2014 | Cojuangco et al. |
| 8,830,193 B2 | 9/2014 | Shah |
| 8,843,239 B2 | 9/2014 | Migdoll et al. |
| D715,835 S | 10/2014 | Montgomery et al. |
| D716,334 S | 10/2014 | Lee et al. |
| D717,809 S | 11/2014 | Tsuru et al. |
| D717,823 S | 11/2014 | Brotman et al. |
| 8,917,274 B2 | 12/2014 | Ma et al. |
| D720,765 S | 1/2015 | Xie et al. |
| D720,766 S | 1/2015 | Mandal et al. |
| D721,382 S | 1/2015 | Brinda et al. |
| D723,576 S | 3/2015 | Jones |
| D724,603 S | 3/2015 | Williams et al. |
| D725,666 S | 3/2015 | Tseng et al. |
| 8,984,436 B1 | 3/2015 | Tseng et al. |
| 8,988,232 B1 | 3/2015 | Sloo et al. |
| D726,735 S | 4/2015 | Asai |
| D727,336 S | 4/2015 | Allison et al. |
| D727,928 S | 4/2015 | Allison et al. |
| D736,223 S | 8/2015 | Park |
| D736,792 S | 8/2015 | Brinda et al. |
| D737,131 S | 8/2015 | Frandsen |
| D737,278 S | 8/2015 | Shin et al. |
| D737,283 S | 8/2015 | Scalisi |
| D739,429 S | 9/2015 | Veilleux et al. |
| D739,864 S | 9/2015 | Kang |
| 9,140,572 B2 | 9/2015 | Millington |
| D740,300 S | 10/2015 | Lee et al. |
| 9,158,974 B1 | 10/2015 | Laska et al. |
| 9,170,707 B1 | 10/2015 | Laska et al. |
| D745,527 S | 12/2015 | Wang |

(56) References Cited

U.S. PATENT DOCUMENTS

| | | |
|---|---|---|
| 9,216,479 B2 | 12/2015 | Takahashi et al. |
| D746,828 S | 1/2016 | Arai et al. |
| D746,849 S | 1/2016 | Anzures et al. |
| D747,333 S | 1/2016 | Supino et al. |
| 9,235,899 B1 | 1/2016 | Kirmani et al. |
| D748,666 S | 2/2016 | Heeter et al. |
| D749,620 S | 2/2016 | Jones |
| D751,090 S | 3/2016 | Hu et al. |
| D752,061 S | 3/2016 | Ahn et al. |
| D752,072 S | 3/2016 | Song |
| D752,107 S | 3/2016 | Yun |
| D752,605 S | 3/2016 | Wang et al. |
| D753,132 S | 4/2016 | Cuthbert et al. |
| D753,151 S | 4/2016 | Lee et al. |
| D753,703 S | 4/2016 | Villamor et al. |
| D753,708 S | 4/2016 | Yang et al. |
| D754,713 S | 4/2016 | Zhang et al. |
| D754,714 S | 4/2016 | Zhang et al. |
| D755,193 S | 5/2016 | Sun et al. |
| D756,379 S | 5/2016 | Apodaca et al. |
| D756,401 S | 5/2016 | Soldner et al. |
| D757,090 S | 5/2016 | Myung |
| D757,746 S | 5/2016 | Lee |
| D757,747 S | 5/2016 | Butcher et al. |
| D757,784 S | 5/2016 | Lee et al. |
| D758,386 S | 6/2016 | Zhang et al. |
| D758,422 S | 6/2016 | Zhao |
| D759,688 S | 6/2016 | Wu |
| 9,361,011 B1 | 6/2016 | Burns |
| 9,361,521 B1 | 6/2016 | McLean et al. |
| 9,380,274 B1 | 6/2016 | McLean et al. |
| D760,769 S | 7/2016 | Ishii et al. |
| D760,792 S | 7/2016 | Liu et al. |
| D761,277 S | 7/2016 | Harvell |
| 9,386,230 B1 | 7/2016 | Duran |
| D762,655 S | 8/2016 | Kai |
| D763,271 S | 8/2016 | Everette et al. |
| D763,306 S | 8/2016 | Lee et al. |
| D763,308 S | 8/2016 | Wang et al. |
| D763,869 S | 8/2016 | Wang et al. |
| D763,888 S | 8/2016 | Patel |
| D763,895 S | 8/2016 | Chaudhri et al. |
| 9,417,637 B2 | 8/2016 | Matsuoka et al. |
| D765,674 S | 9/2016 | Kim |
| D765,678 S | 9/2016 | Goux |
| D766,958 S | 9/2016 | Salazar Cardozo et al. |
| 9,454,820 B1 | 9/2016 | Kirmani |
| D768,687 S | 10/2016 | Bae et al. |
| D769,897 S | 10/2016 | Li |
| D769,930 S | 10/2016 | Agrawal |
| 9,471,452 B2 | 10/2016 | Mcelhinney et al. |
| D770,517 S | 11/2016 | Peng et al. |
| D771,645 S | 11/2016 | Jewitt et al. |
| D772,257 S | 11/2016 | Furutani et al. |
| D772,894 S | 11/2016 | Zhao et al. |
| D773,531 S | 12/2016 | Toth et al. |
| D775,165 S | 12/2016 | Sun et al. |
| 9,513,642 B2 | 12/2016 | Rogers et al. |
| D775,658 S | 1/2017 | Luo et al. |
| D776,126 S | 1/2017 | Lai et al. |
| D776,130 S | 1/2017 | Contreras et al. |
| D776,680 S | 1/2017 | Bae et al. |
| D776,690 S | 1/2017 | Tsujimoto et al. |
| D776,702 S | 1/2017 | Huang et al. |
| D777,744 S | 1/2017 | Wang et al. |
| D779,504 S | 2/2017 | Cabrera et al. |
| D779,533 S | 2/2017 | Liu |
| D780,785 S | 3/2017 | Hansen et al. |
| D781,299 S | 3/2017 | Yun et al. |
| 9,591,215 B1* | 3/2017 | Miller .................. H04N 5/2257 |
| D783,641 S | 4/2017 | Elston et al. |
| D783,652 S | 4/2017 | Guan et al. |
| D784,363 S | 4/2017 | Fleming et al. |
| D784,400 S | 4/2017 | Joi |
| 9,619,984 B2 | 4/2017 | Donovan et al. |
| D786,932 S | 5/2017 | Kim et al. |
| D795,927 S | 5/2017 | Bischhoff et al. |
| 9,660,122 B2 | 5/2017 | Tan |
| D790,581 S | 6/2017 | Chaudhri et al. |
| D791,806 S | 7/2017 | Brewington et al. |
| D794,047 S | 8/2017 | Gandhi et al. |
| D795,292 S | 8/2017 | Loosli et al. |
| D795,919 S | 8/2017 | Bischoff et al. |
| D796,535 S | 9/2017 | Gaur et al. |
| D796,540 S | 9/2017 | McLean et al. |
| D797,131 S | 9/2017 | Mizono et al. |
| D797,772 S | 9/2017 | Mizono et al. |
| D800,747 S | 10/2017 | Lee et al. |
| D800,752 S | 10/2017 | Hersh et al. |
| 9,778,830 B1 | 10/2017 | Dubin |
| D803,233 S | 11/2017 | Wilberding |
| D803,241 S | 11/2017 | Mizono et al. |
| D803,242 S | 11/2017 | Mizono et al. |
| D805,548 S | 12/2017 | King et al. |
| D806,114 S | 12/2017 | Kim et al. |
| 9,838,602 B2 | 12/2017 | Duran et al. |
| D807,376 S | 1/2018 | Mizono et al. |
| D809,522 S | 2/2018 | Mizono et al. |
| D810,116 S | 2/2018 | McLean et al. |
| 9,898,175 B2 | 2/2018 | Fiedler |
| D815,144 S | 4/2018 | Feng et al. |
| D817,337 S | 5/2018 | Wei |
| D817,357 S | 5/2018 | Barajas et al. |
| D818,000 S | 5/2018 | Lee et al. |
| D819,047 S | 5/2018 | Bates et al. |
| D819,075 S | 5/2018 | Tsuji et al. |
| 9,979,862 B1 | 5/2018 | Xiong et al. |
| D821,407 S | 6/2018 | Wilberding |
| D821,410 S | 6/2018 | Vinna et al. |
| D821,441 S | 6/2018 | Wilberding et al. |
| D821,443 S | 6/2018 | Jang et al. |
| D823,867 S | 7/2018 | Berlow |
| D823,891 S | 7/2018 | Lupei et al. |
| D824,416 S | 7/2018 | Memmelaar et al. |
| D824,926 S | 8/2018 | De La Garza |
| D831,673 S | 10/2018 | O'Rourke et al. |
| 10,091,020 B2 | 10/2018 | Han et al. |
| 10,095,933 B2 | 10/2018 | Sherry |
| 10,133,443 B2 | 11/2018 | Von Dehsen et al. |
| 10,145,577 B2 | 12/2018 | Bruck et al. |
| 10,156,959 B2 | 12/2018 | Fulker et al. |
| D837,237 S | 1/2019 | Fraser et al. |
| D841,659 S | 2/2019 | Mehta et al. |
| D842,867 S | 3/2019 | Jedrzejowicz et al. |
| D842,874 S | 3/2019 | Tashiro et al. |
| D842,891 S | 3/2019 | MacLean et al. |
| D843,398 S | 3/2019 | Stewart et al. |
| D844,668 S | 4/2019 | Lee et al. |
| D849,030 S | 5/2019 | Shook et al. |
| 10,281,507 B2 | 5/2019 | Schuh et al. |
| 10,352,496 B2 | 7/2019 | Mehdi et al. |
| 10,353,576 B2 | 7/2019 | Coffman et al. |
| 10,386,999 B2 | 8/2019 | Burns et al. |
| D868,797 S | 12/2019 | Blum et al. |
| 10,586,433 B2 | 3/2020 | Stewart et al. |
| 10,683,962 B2 | 6/2020 | Raghupathy et al. |
| 10,819,921 B2 | 10/2020 | Roth et al. |
| 10,972,685 B2 | 4/2021 | Mehdi et al. |
| 11,035,517 B2 | 6/2021 | Raghupathy et al. |
| 11,156,325 B2 | 10/2021 | Mehdi et al. |
| 2002/0049979 A1 | 4/2002 | White et al. |
| 2002/0116120 A1 | 8/2002 | Ruiz et al. |
| 2003/0214733 A1 | 11/2003 | Fujikawa et al. |
| 2004/0113770 A1 | 6/2004 | Falk et al. |
| 2004/0177149 A1 | 9/2004 | Zullo et al. |
| 2004/0260427 A1 | 12/2004 | Wimsatt |
| 2005/0046723 A1 | 3/2005 | Bean et al. |
| 2005/0082480 A1 | 4/2005 | Wagner et al. |
| 2005/0104958 A1 | 5/2005 | Egnal et al. |
| 2005/0289615 A1 | 12/2005 | Nishitani |
| 2006/0288392 A1 | 12/2006 | Fleming |
| 2007/0024706 A1 | 2/2007 | Brannon |
| 2007/0025688 A1 | 2/2007 | Pejhan |
| 2007/0033632 A1 | 2/2007 | Baynger et al. |

(56) References Cited

U.S. PATENT DOCUMENTS

| | | |
|---|---|---|
| 2008/0088706 A1 | 4/2008 | Girgensohn et al. |
| 2008/0174570 A1 | 7/2008 | Jobs et al. |
| 2008/0181498 A1 | 7/2008 | Swenson et al. |
| 2008/0263468 A1 | 10/2008 | Cappione et al. |
| 2008/0266393 A1 | 10/2008 | Park |
| 2008/0266445 A1 | 10/2008 | Park |
| 2009/0002157 A1 | 1/2009 | Donavan et al. |
| 2009/0002492 A1 | 1/2009 | Velipasalar et al. |
| 2009/0021583 A1 | 1/2009 | Salgar et al. |
| 2009/0075694 A1 | 3/2009 | Kim et al. |
| 2009/0164439 A1 | 6/2009 | Nevins |
| 2009/0178007 A1 | 7/2009 | Matas et al. |
| 2009/0220206 A1 | 9/2009 | Kisliakov |
| 2009/0284601 A1 | 11/2009 | Eledath |
| 2009/0288011 A1 | 11/2009 | Piran et al. |
| 2010/0023865 A1 | 1/2010 | Fulker et al. |
| 2010/0061446 A1 | 3/2010 | Hands et al. |
| 2010/0079591 A1 | 4/2010 | Lee |
| 2010/0124274 A1 | 5/2010 | Cheok et al. |
| 2010/0131457 A1 | 5/2010 | Heimendinger |
| 2010/0206999 A1 | 8/2010 | Li et al. |
| 2010/0244175 A1 | 9/2010 | Park |
| 2010/0321183 A1 | 12/2010 | Donovan et al. |
| 2011/0040760 A1 | 2/2011 | Fleishman et al. |
| 2011/0090457 A1 | 4/2011 | Shikaumi et al. |
| 2011/0185269 A1 | 7/2011 | Finkelstein et al. |
| 2011/0199517 A1 | 8/2011 | Laberge |
| 2011/0205435 A1 | 8/2011 | Lee et al. |
| 2011/0316697 A1 | 12/2011 | Krahnstoever et al. |
| 2012/0026337 A1* | 2/2012 | Boulanger ............ G01J 1/44 348/164 |
| 2012/0036480 A1 | 2/2012 | Warner et al. |
| 2012/0066608 A1 | 3/2012 | Sundermeyer et al. |
| 2012/0130513 A1 | 5/2012 | Hao et al. |
| 2012/0273630 A1 | 11/2012 | Gillespie-Brown et al. |
| 2012/0280941 A1 | 11/2012 | Hu |
| 2012/0317299 A1 | 12/2012 | Sathianathan et al. |
| 2012/0323930 A1 | 12/2012 | Kennberg et al. |
| 2013/0016122 A1 | 1/2013 | Bhatt et al. |
| 2013/0048837 A1 | 2/2013 | Pope et al. |
| 2013/0067365 A1 | 3/2013 | Shrufi et al. |
| 2013/0072308 A1 | 3/2013 | Peck et al. |
| 2013/0083184 A1 | 4/2013 | Yogesan et al. |
| 2013/0089231 A1* | 4/2013 | Wilk .................... H04M 1/03 381/397 |
| 2013/0090767 A1 | 4/2013 | Bruck et al. |
| 2013/0091432 A1 | 4/2013 | Shet et al. |
| 2013/0129307 A1 | 5/2013 | Choe et al. |
| 2013/0132908 A1 | 5/2013 | Lee et al. |
| 2013/0145270 A1 | 6/2013 | Piran et al. |
| 2013/0173064 A1 | 7/2013 | Fadell et al. |
| 2013/0179836 A1 | 7/2013 | Han et al. |
| 2013/0185150 A1 | 7/2013 | Crum |
| 2013/0211783 A1 | 8/2013 | Fisher et al. |
| 2013/0251150 A1 | 9/2013 | Chassagne |
| 2013/0258313 A1 | 10/2013 | Orband |
| 2013/0263034 A1 | 10/2013 | Bruck et al. |
| 2013/0268129 A1 | 10/2013 | Fadell et al. |
| 2013/0282421 A1 | 10/2013 | Graff et al. |
| 2013/0311909 A1 | 11/2013 | Howard et al. |
| 2013/0325332 A1 | 12/2013 | Rhee et al. |
| 2013/0328997 A1 | 12/2013 | Desi |
| 2013/0332886 A1 | 12/2013 | Cranfill et al. |
| 2014/0012574 A1 | 1/2014 | Pasupalak et al. |
| 2014/0013243 A1 | 1/2014 | Flynn, III et al. |
| 2014/0026061 A1 | 1/2014 | Kim et al. |
| 2014/0033071 A1 | 1/2014 | Gruber et al. |
| 2014/0043485 A1 | 2/2014 | Bateman et al. |
| 2014/0050455 A1 | 2/2014 | Ni et al. |
| 2014/0064738 A1 | 3/2014 | Chen et al. |
| 2014/0098247 A1 | 4/2014 | Rao et al. |
| 2014/0137685 A1 | 5/2014 | Iwayama |
| 2014/0189518 A1 | 7/2014 | Kim et al. |
| 2014/0189586 A1 | 7/2014 | Waldman et al. |
| 2014/0218517 A1 | 8/2014 | Kim et al. |
| 2014/0222424 A1 | 8/2014 | Hartford et al. |
| 2014/0232873 A1 | 8/2014 | Meganathan |
| 2014/0277795 A1 | 9/2014 | Matsuoka et al. |
| 2014/0313377 A1 | 10/2014 | Hampton |
| 2014/0333530 A1 | 11/2014 | Agnetta |
| 2014/0333776 A1 | 11/2014 | Dedeoglu |
| 2014/0365019 A1 | 12/2014 | Gourlay et al. |
| 2014/0375819 A1 | 12/2014 | Larsen et al. |
| 2015/0023650 A1 | 1/2015 | Austin et al. |
| 2015/0035987 A1 | 2/2015 | Fernandez |
| 2015/0049243 A1* | 2/2015 | Samuels ............... G03B 17/55 348/374 |
| 2015/0058709 A1 | 2/2015 | Zaletel |
| 2015/0058730 A1 | 2/2015 | Dubin et al. |
| 2015/0097689 A1 | 4/2015 | Logue et al. |
| 2015/0113432 A1 | 4/2015 | Jung et al. |
| 2015/0113461 A1 | 4/2015 | Kasten et al. |
| 2015/0117513 A1 | 4/2015 | Sarafa et al. |
| 2015/0143239 A1 | 5/2015 | Birkbeck et al. |
| 2015/0173846 A1 | 6/2015 | Schneider et al. |
| 2015/0193127 A1 | 7/2015 | Chai et al. |
| 2015/0208205 A1 | 7/2015 | Chan et al. |
| 2015/0224650 A1 | 8/2015 | Xu et al. |
| 2015/0227196 A1 | 8/2015 | Fujii et al. |
| 2015/0242404 A1 | 8/2015 | Underwood, IV et al. |
| 2015/0248270 A1 | 9/2015 | Lang |
| 2015/0248275 A1 | 9/2015 | Gallo et al. |
| 2015/0269643 A1 | 9/2015 | Riley et al. |
| 2015/0287310 A1 | 10/2015 | Deiiuliis et al. |
| 2015/0310280 A1 | 10/2015 | Bentley et al. |
| 2015/0350265 A1 | 12/2015 | O'Brien |
| 2015/0350611 A1 | 12/2015 | Pearson et al. |
| 2016/0004390 A1 | 1/2016 | Laska et al. |
| 2016/0026329 A1 | 1/2016 | Fadell et al. |
| 2016/0034574 A1 | 2/2016 | Kang |
| 2016/0041724 A1 | 2/2016 | Kirkby et al. |
| 2016/0043905 A1 | 2/2016 | Fiedler |
| 2016/0054175 A1 | 2/2016 | Jia et al. |
| 2016/0086038 A1 | 3/2016 | Scanlon et al. |
| 2016/0088326 A1 | 3/2016 | Solomon et al. |
| 2016/0092720 A1 | 3/2016 | Lee et al. |
| 2016/0105331 A1 | 4/2016 | Han et al. |
| 2016/0105747 A1 | 4/2016 | Cheng |
| 2016/0105847 A1 | 4/2016 | Smith et al. |
| 2016/0110064 A1 | 4/2016 | Shapira |
| 2016/0139671 A1 | 5/2016 | Jun et al. |
| 2016/0139747 A1 | 5/2016 | Kocienda et al. |
| 2016/0147406 A1 | 5/2016 | Yi |
| 2016/0155315 A1 | 6/2016 | McElhinney et al. |
| 2016/0205318 A1 | 7/2016 | Wang et al. |
| 2016/0220743 A1 | 8/2016 | Guthrie et al. |
| 2016/0260414 A1 | 9/2016 | Yang |
| 2016/0306509 A1 | 10/2016 | Jeon et al. |
| 2016/0320875 A1 | 11/2016 | Yoshida |
| 2016/0335139 A1 | 11/2016 | Hurley et al. |
| 2016/0349936 A1 | 12/2016 | Cho et al. |
| 2016/0353531 A1 | 12/2016 | Conner et al. |
| 2016/0358436 A1 | 12/2016 | Wautier et al. |
| 2016/0364114 A1 | 12/2016 | Von Dehsen et al. |
| 2016/0366330 A1 | 12/2016 | Boliek et al. |
| 2017/0003720 A1 | 1/2017 | Robinson et al. |
| 2017/0010790 A1 | 1/2017 | Glover et al. |
| 2017/0017376 A1 | 1/2017 | Han et al. |
| 2017/0017384 A1 | 1/2017 | Lee |
| 2017/0017392 A1 | 1/2017 | Castaneda et al. |
| 2017/0034430 A1 | 2/2017 | Fu et al. |
| 2017/0060374 A1 | 3/2017 | Murrels et al. |
| 2017/0060399 A1 | 3/2017 | Hough et al. |
| 2017/0089739 A1 | 3/2017 | Gallo |
| 2017/0126975 A1 | 5/2017 | Duran et al. |
| 2017/0140221 A1 | 5/2017 | Ollila et al. |
| 2017/0168374 A1* | 6/2017 | Lim ...................... G03B 11/06 |
| 2017/0186079 A1 | 6/2017 | Kim et al. |
| 2017/0201850 A1 | 7/2017 | Raleigh et al. |
| 2017/0207949 A1 | 7/2017 | Donaovan et al. |
| 2017/0286913 A1 | 10/2017 | Liu et al. |
| 2017/0308390 A1 | 10/2017 | Venis et al. |
| 2017/0329511 A1 | 11/2017 | Ueno et al. |
| 2017/0336920 A1 | 11/2017 | Chan et al. |

(56) References Cited

U.S. PATENT DOCUMENTS

| | | | |
|---|---|---|---|
| 2017/0357439 | A1 | 12/2017 | Lemay et al. |
| 2018/0013934 | A1 | 1/2018 | Germe et al. |
| 2018/0018081 | A1 | 1/2018 | Dattilo-Green et al. |
| 2018/0019889 | A1 | 1/2018 | Burns et al. |
| 2018/0048819 | A1 | 2/2018 | Duran et al. |
| 2018/0101297 | A1 | 4/2018 | Yang et al. |
| 2018/0113577 | A1 | 4/2018 | Burns et al. |
| 2018/0115788 | A1 | 4/2018 | Burns et al. |
| 2018/0129380 | A1 | 5/2018 | Suh et al. |
| 2018/0136819 | A1 | 5/2018 | Lee et al. |
| 2018/0144615 | A1 | 5/2018 | Kinney et al. |
| 2018/0157915 | A1 | 6/2018 | Sherry |
| 2018/0187954 | A1 | 7/2018 | Yang et al. |
| 2018/0232592 | A1 | 8/2018 | Stewart et al. |
| 2018/0259832 | A1* | 9/2018 | Chen ............... G03B 17/561 |
| 2018/0263104 | A1* | 9/2018 | Hamada ............ H04N 5/2253 |
| 2018/0267390 | A1* | 9/2018 | Kim .................. G03B 17/55 |
| 2018/0311582 | A1 | 11/2018 | Gerhard et al. |
| 2018/0330169 | A1 | 11/2018 | van Hoof et al. |
| 2018/0340646 | A1 | 11/2018 | Mehdi et al. |
| 2018/0343402 | A1 | 11/2018 | Roth et al. |
| 2018/0343403 | A1 | 11/2018 | Mehdi et al. |
| 2018/0343772 | A1 | 11/2018 | Raghupathy et al. |
| 2018/0349708 | A1 | 12/2018 | van Hoof et al. |
| 2019/0323651 | A1 | 10/2019 | Mehdi et al. |
| 2019/0394905 | A1* | 12/2019 | Jin .................... H05K 7/20509 |
| 2020/0236266 | A1 | 7/2020 | Krammer et al. |
| 2020/0332947 | A1 | 10/2020 | Raghupathy et al. |
| 2021/0029308 | A1 | 1/2021 | Roth et al. |
| 2021/0216787 | A1 | 7/2021 | Van Hoof et al. |

FOREIGN PATENT DOCUMENTS

| | | |
|---|---|---|
| CN | 202083867 | 12/2011 |
| CN | 103167225 | 6/2013 |
| CN | 203563151 | 4/2014 |
| CN | 204272247 | 4/2015 |
| CN | 105072325 | 11/2015 |
| CN | 105813554 | 7/2016 |
| CN | 106205052 | 12/2016 |
| CN | 206042146 | 3/2017 |
| CN | 206136087 | 4/2017 |
| CN | 206181243 | 5/2017 |
| JP | 2009219019 | 9/2009 |
| JP | 2015139165 | 7/2015 |
| KR | 20080005117 | 11/2008 |
| KR | 20120068655 | 6/2012 |
| KR | 20150065169 | 6/2015 |
| KR | 20150092670 | 8/2015 |
| WO | 2006120596 | 11/2006 |
| WO | 2009138037 | 11/2009 |
| WO | 2013009828 | 1/2013 |
| WO | 2014137372 | 9/2014 |

OTHER PUBLICATIONS

"Advisory Action", U.S. Appl. No. 15/607,387, dated Nov. 1, 2019, 3 pages.
"Advisory Action", U.S. Appl. No. 15/608,904, dated Nov. 8, 2019, 3 pages.
"AppCrawlr, ipCam FC—IP camera surveillance (ios)", Retrieved at: appcrawlr.com/ios/ipcam-fc-ip-camera-surveillance—on Jul. 16, 2015, 2 pages.
"Arlo on the App Store on iTunes", Retrieved at: https://apps.apple.com/us/app/arlo/id925911312—on Jul. 15, 2015, 2 pages.
"Bluetooth-controlled Pan/Tilt Servo Platform Using Android as Remote", Retrieved at: www.techbitar.com/bluetooth-controlled-pan-tilt-servo.html—on Nov. 19, 2020, 8 pages.
"D-Link Corporation, mydlink App", Retrieved at: www.mydlink.com/apps—on Jul. 15, 2015, 4 pages.
"D-Link Corporation, mydlink Lite", downloaded Jul. 15, 2015 from: itunes.apple.com/us/app/mydlink-lite/id372571229?mt=8, 2 pages.
"D-Link Corporation, mydlink+,", downloaded Jul. 15, 2015, From: itunes.apple.com/us/app/mydlink/id479832296?mt=8, 2 pages.
"Dropcam", Retrieved from: https://play.google.com/store/apps/details?id =com.dropcam.android, Aug. 20, 2015, 3 pages.
"Extended European Search Report", EP Application No. 18156966.6, dated Jun. 26, 2018, 11 pages.
"Features> Button Bars", Available from Internet: http://insiteout.brinkster.net/Website%20New/buttonbars.asp, May 8, 2011, 6 pages.
"Final Office Action", U.S. Appl. No. 15/607,387, dated Aug. 21, 2019, 12 pages.
"Final Office Action", U.S. Appl. No. 15/608,904, dated Jan. 22, 2020, 18 pages.
"Final Office Action", U.S. Appl. No. 15/608,904, dated Aug. 1, 2019, 21 pages.
"Final Office Action", U.S. Appl. No. 15/608,904, dated Dec. 28, 2020, 24 pages.
"Final Office Action", U.S. Appl. No. 15/607,380, dated Dec. 20, 2019, 6 pages.
"First Action Interview Office Action", U.S. Appl. No. 15/607,380, dated Mar. 18, 2019, 13 pages.
"First Action Interview Office Action", U.S. Appl. No. 15/607,387, dated Mar. 7, 2019, 15 pages.
"First Action Interview Office Action", U.S. Appl. No. 15/607,368, dated Mar. 18, 2019, 19 pages.
"First Action Interview Office Action", U.S. Appl. No. 15/608,904, dated Dec. 10, 2018, 4 pages.
"First Action Interview Office Action", U.S. Appl. No. 15/594,518, dated Dec. 11, 2018, 4 pages.
"Foreign Office Action", KR Application No. 2019-7037435, dated Nov. 17, 2020, 12 pages.
"Foreign Office Action", EP Application No. 18156966.6, dated May 25, 2020, 5 pages.
"Foreign Office Action", EP Application No. 18714648.5, dated Jan. 27, 2021, 7 pages.
"Foto de archivo", Retrieved at: https://es.123rf.com/photo_37507296_diseno-transparente-plantilla-de-interfaz-de-usuario-movil-disposicion-para-el-movil-pagina-web-il.html, Apr. 23, 2015, 3 pages.
"Google Image Search of Nest Icon", Retrieved from: https://www.google.com/search?q=nest+icon&rlz=1C1GCEBenUS799US799&biw=1920&bih=1109&source=Int&tbs=cdr%3A1%2Ccdnnin%3A%2Ccdnnax%3A7%2, 2 pages.
"International Preliminary Report on Patentability", Application No. PCT/US2018/020900, dated Nov. 26, 2019, 12 pages.
"International Preliminary Report on Patentability", Application No. PCT/US2018/020919, dated Nov. 12, 2019, 8 pages.
"International Search Report and Written Opinion", Application No. PCT/US2015/039425, dated Sep. 25, 2015, 12 pages.
"International Search Report and Written Opinion", Application No. PCT/US2018/020900, dated Jul. 2, 2018, 18 pages.
"International Search Report and Written Opinion", Application No. PCT/US2018/020919, dated Jun. 11, 2018, 26 pages.
"Metal Fence on a dark background", Retrieved at: https://stockfresh.com/image/2626471/metal-fence-on-a-dark-background, Feb. 28, 2013, 1 page.
"Mini UI toolkit PSD Download", www.freepsds123.com/2014/06/21/mini-ui-toolkit-psd-download/, Jun. 21, 2014, 1 page.
"Netgear, Home Security Systems/ Security Cameras/ Ario", http://www.arlo.com/en-us/, Jul. 16, 2015, 6 pages.
"Non-Final Office Action", U.S. Appl. No. 16/459,704, dated Mar. 2, 2021, 11 pages.
"Non-Final Office Action", U.S. Appl. No. 15/606,888, dated Oct. 5, 2018, 11 pages.
"Non-Final Office Action", U.S. Appl. No. 15/607,380, dated Apr. 7, 2020, 12 pages.
"Non-Final Office Action", U.S. Appl. No. 15/607,380, dated Jul. 31, 2020, 17 pages.
"Non-Final Office Action", U.S. Appl. No. 15/607,368, dated Jan. 22, 2020, 18 pages.
"Non-Final Office Action", U.S. Appl. No. 15/608,904, dated Aug. 7, 2020, 21 pages.
"Non-Final Office Action", U.S. Appl. No. 15/594,518, dated Apr. 2, 2019, 25 pages.

(56) References Cited

OTHER PUBLICATIONS

"Non-Final Office Action", U.S. Appl. No. 15/608,904, dated Apr. 11, 2019, 26 pages.
"Non-Final Office Action", U.S. Appl. No. 16/903,049, dated Sep. 16, 2020, 9 pages.
"Notice of Allowance", U.S. Appl. No. 15/607,387, dated Feb. 10, 2020, 16 pages.
"Notice of Allowance", U.S. Appl. No. 15/607,380, dated Feb. 2, 2021, 5 pages.
"Notice of Allowance", U.S. Appl. No. 15/607,368, dated Jun. 19, 2020, 5 pages.
"Notice of Allowance", U.S. Appl. No. 16/903,049, dated Feb. 9, 2021, 8 pages.
"Notice of Allowance", U.S. Appl. No. 15/606,888, dated Mar. 6, 2019, 8 pages.
"Octopussy (1983)—Cancelled", https://www.mi6-hq.com/sections/games/octopussy_1983, Oct. 2, 2014, 2 pages.
"Pre-Interview First Office Action", U.S. Appl. No. 15/607,368, dated Jan. 11, 2019, 3 pages.
"Pre-Interview First Office Action", U.S. Appl. No. 15/607,380, dated Jan. 11, 2019, 3 pages.
"Pre-Interview First Office Action", U.S. Appl. No. 15/607,387, dated Oct. 12, 2018, 3 pages.
"Pre-Interview First Office Action", U.S. Appl. No. 15/594,518, dated Sep. 4, 2018, 5 pages.
"Pre-Interview First Office Action", U.S. Appl. No. 15/608,904, dated Sep. 7, 2018, 5 pages.
"Pulsating Animation", Retrieved at: https://dribbble.com/shots/3218158-Pulsating-animation, Jan. 15, 2017, 1 page.
"Simi, ipCamFC—IP camera surveillance", Retrieved at: itunes.apple.com/us/app/ipcam-fc-ip-camera-surveillance/id548480721?mt=8—on Jul. 15, 2015, 2 pages.
"Stock Vector—Web Site Interface Icons // Button Bar Series", https://www.alamy.com/web-site-interface-icons-button-bar-series-image64003090.html, Aug. 2010, 1 page.
"Supplemental Notice of Allowance", U.S. Appl. No. 15/607,380, dated Mar. 3, 2021, 2 pages.
"Two-Shot Injection Molding Solutions", https://geminigroup.net/plastics/two-shot-and-injection-molding-tpi/processes/two-shot-multi-shot/, May 14, 2020, 8 pages.
"Vector Video Player", Retrieved at: https://www.shutterstock.com/fr/image-vector/vector-audio-video-player-web-101573365, Aug. 21, 2014, 4 pages.
"Viewer for D-Link Cams IOS Version 3.1.2, 2013", Retrieved at: http://www.eyespyfx.com/dlink.php—on Jul. 15, 2015, 19 pages.
Ahmed, Nafees, "5 Best Video Editing Apps for Android Devices", Retrieved at: http://techbuzzes.com/2013/03/best-video-editing-apps-for-android/, Mar. 23, 2013, 10 pages.
Baer, Drake, "Apple Has Reportedly Reversed the Ban on This Mindfulness App From the App Store", Apr. 12, 2017, 2 pages.
Blatner, , "WiCam: Wireless iPhone Camera, Rochester Institute of Technology", Retrieved at: www.ce/rit/edu/research/projects/2010-spring/WICam/index.html—on Jul. 15, 2015, 1 page.
Fitzner, Michael, "Editing Effects Software to Make Your Video Sing", May 1, 2012, 7 pages.
Hoang, Le, "YouTube: How to Find Previously Watched Videos", Retrieved at: https://www.tech-recipes.com/rx/11104/youtube-how-to-find-all-the-previously-watched-videos/, Feb. 15, 2011, 2 pages.
Lipton, U A. et al., "Moving Target Classification and Tracking from Real-Time Video", Oct. 1998, 7 pages.
Mckenna, Stephen J. et al., "Tracking Groups of People", Oct. 2000, 15 pages.
Mooji, Andre, "Tap to Begin", Available at: https://dribbble.com/shots/3113672-Tap-to-Begin, 2016, 2 pages.
Nunal, Paul, "Best Android apps for videographers and video editors", May 3, 2012, 12 pages.
Raiz, Greg, "Wireframe toolkit for Keynote and Powerpoint", Jun. 29, 2011, 7 pages.
Russel, Holly, "Nest Aware, and why the Nest Cam subscription makes sense", https://www.androidcentral.com/nest-aware-and-why-nest-cam-subscription-makes-sense, Jul. 3, 2015, 5 pages.
Tenon, Biff, "Abstract background with animation of flicker and moving patterns from clear colorful circles. Animation of seamless loop", Retrieved at: https://www.shutterstock.com/fr/video/clip-24321839-abstract-background-animation-flicker-moving-patterns-clear—on Nov. 2020, 3 pages.
Mola, Paul et al., "Rapid Object Detection Using a Boosted Cascade of Simple Features", Feb. 2001, 11 pages.
Visavadia, Jay, "i0S7 Wireframe", https://dribbble.com/shots/1352315-i0S7-Wireframe, Dec. 19, 2013, 1 page.
Wilson, Phillip I. et al., "Facial Feature Detection Using Haar Classifiers", Apr. 2006, 7 pages.
Wollerton, Megan, "Netgear Arlo Smart Home Security review: Netgear's Arlo defies typical security camera limitations", www.cnet.com/products/netgear-arlo-smart-home-security-kit, Feb. 2, 2015, 5 pages.
Wollerton, Megan, "Turn your old iPod into a security camera for free, CNET,", https://www.cnet.com/how-to/turn-your-old-ipod-into-a-security-camera-for-free/, Dec. 17, 2014, 3 pages.
"Foreign Notice of Allowance", KR Application No. 10-2019-7037435, dated May 25, 2021, 4 pages.
"Foreign Office Action", CN Application No. 201880033742.0, dated May 27, 2021, 26 pages.
"Notice of Allowance", U.S. Appl. No. 16/459,704, dated Jul. 23, 2021, 8 pages.
"Non-Final Office Action", U.S. Appl. No. 17/067,367, dated Jun. 29, 2021, 18 pages.
"Final Office Action", U.S. Appl. No. 17/067,367, dated Sep. 27, 2021, 18 pages.
"Foreign Office Action", JP Application No. 2019-564859, dated Aug. 17, 2021, 5 pages.
"Summons to Attend Oral Proceedings", EP Application No. 18714648.5, Oct. 7, 2021, 11 pages.
"Extended European Search Report", EP Application No. 21194280.0, dated Nov. 25, 2021, 12 pages.
"Foreign Office Action", CN Application No. 201880033742.0, dated Nov. 12, 2021, 18 pages.
"Foreign Office Action", EP Application No. 18714098.3, dated Jan. 18, 2022, 6 pages.
"Non-Final Office Action", U.S. Appl. No. 17/067,367, dated Mar. 21, 2022, 8 pages.

\* cited by examiner

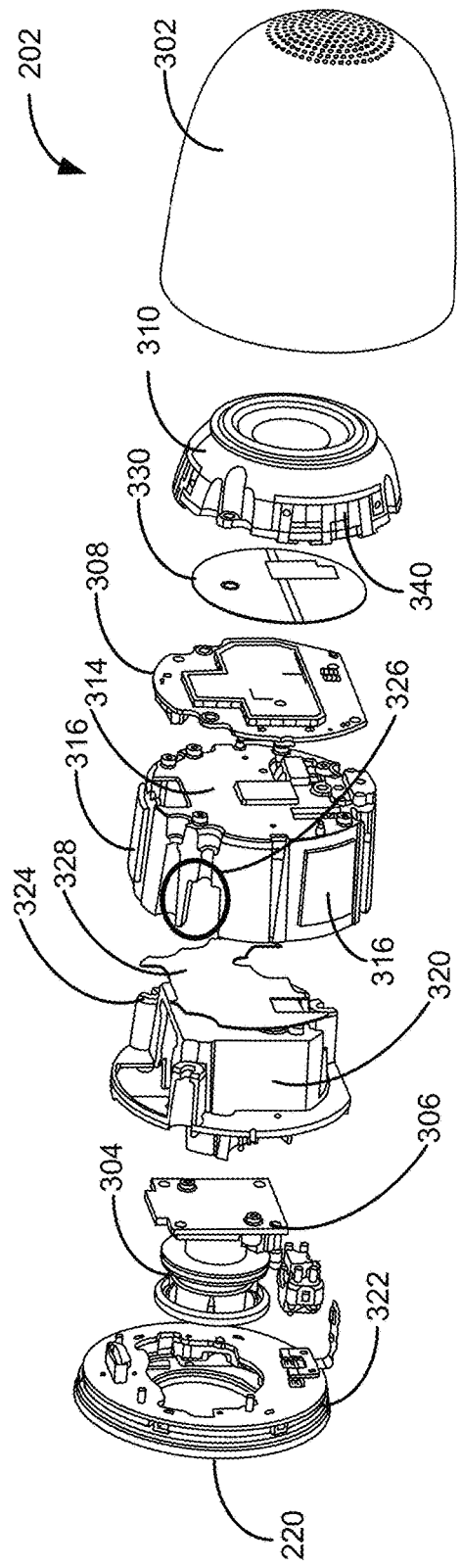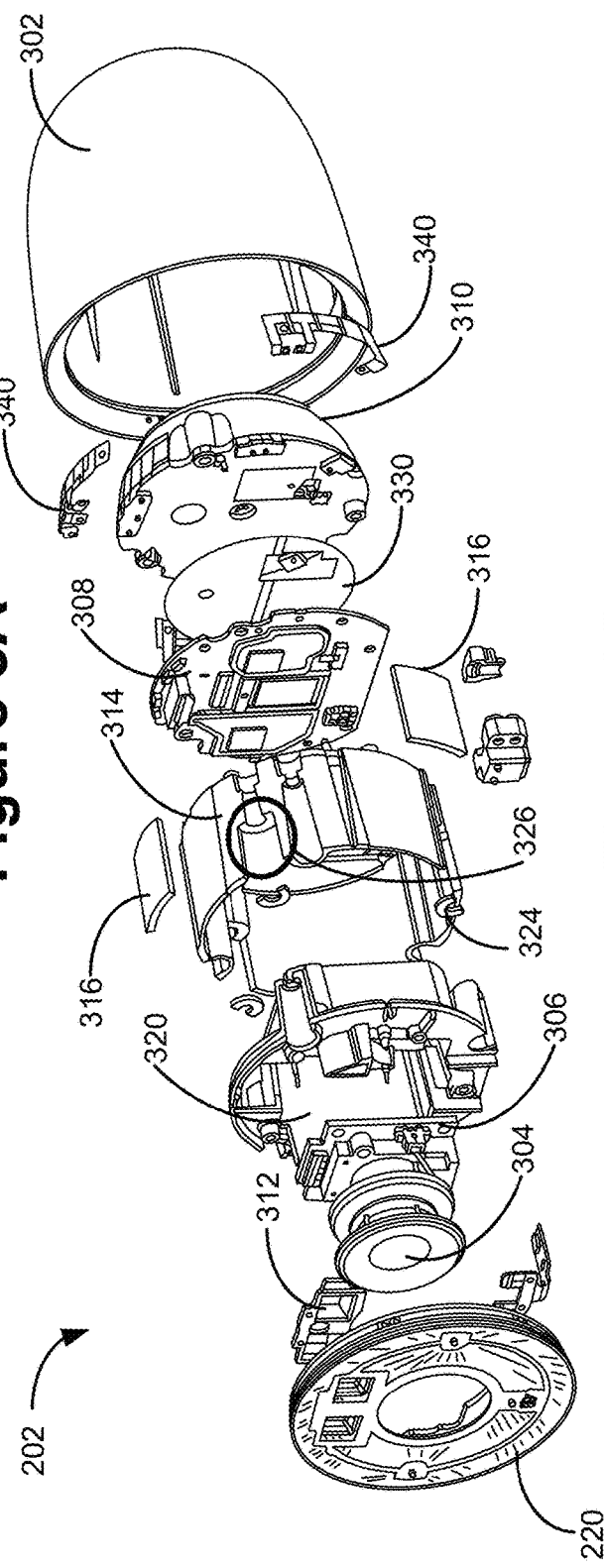

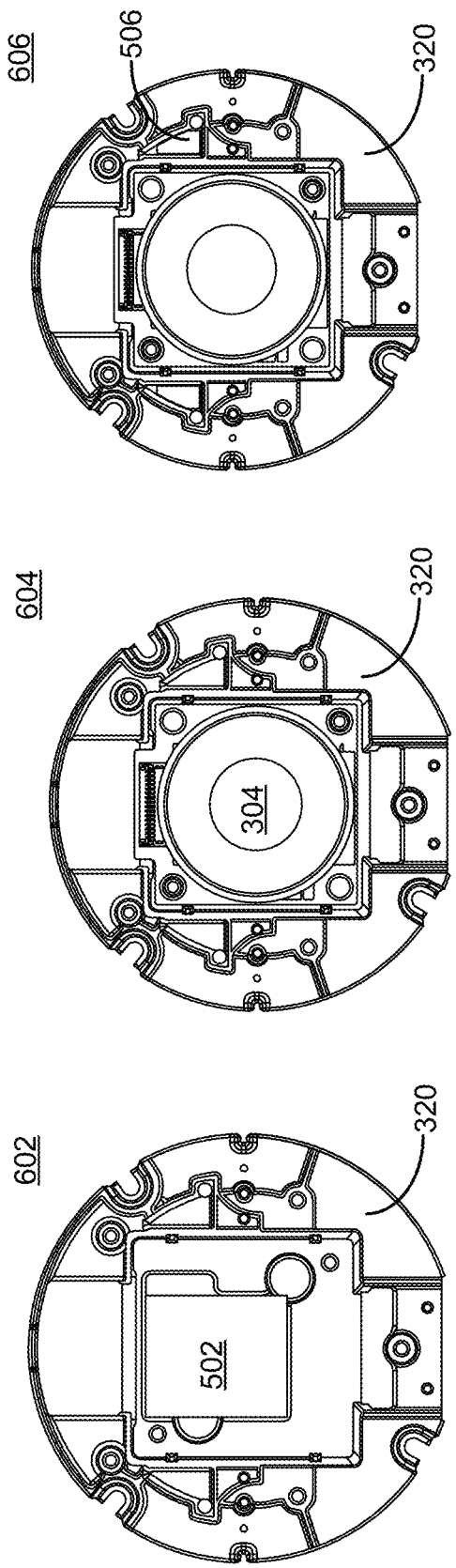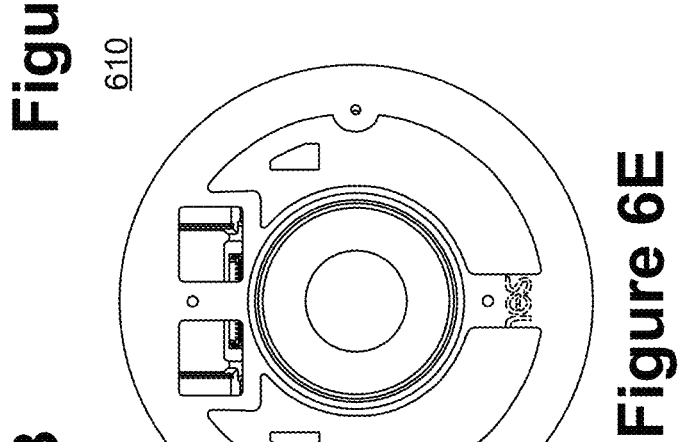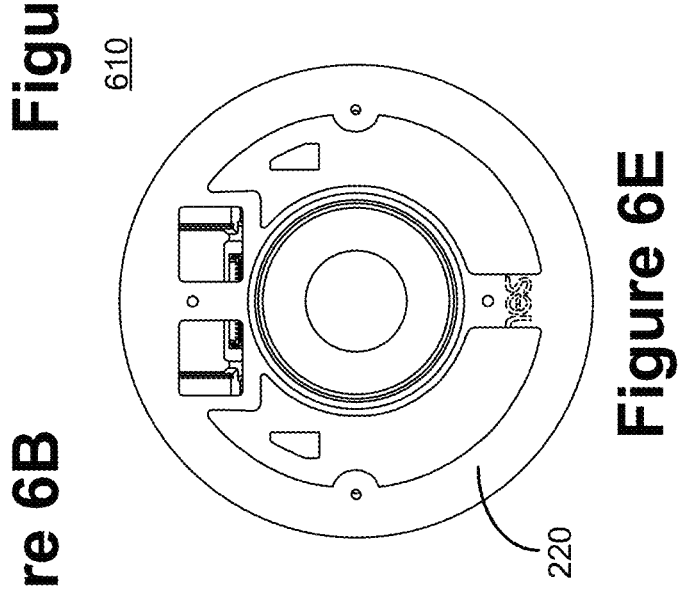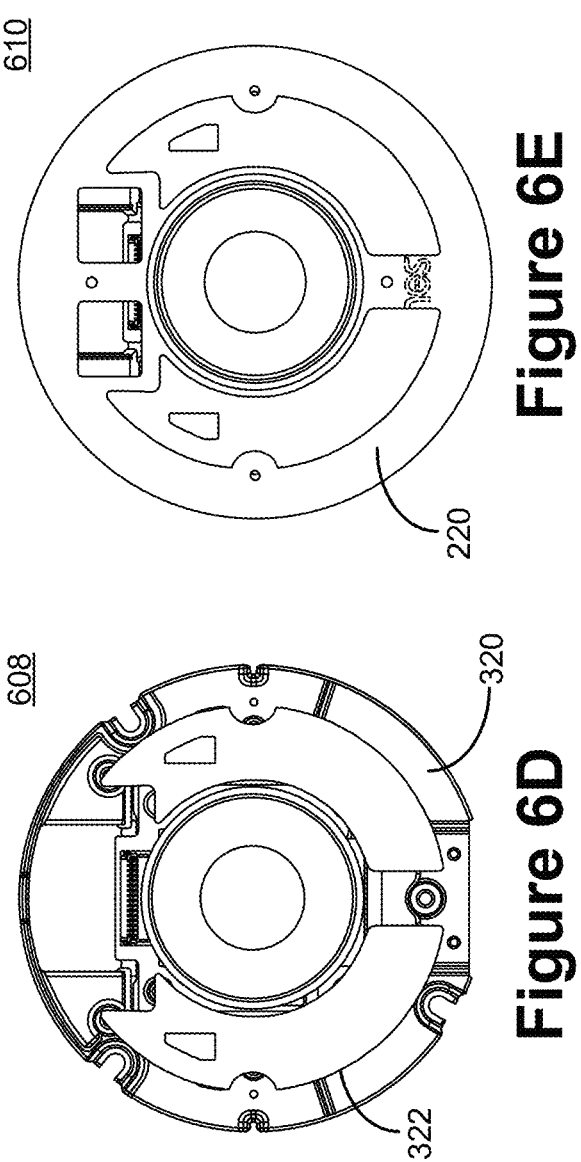
Figure 6A
Figure 6B
Figure 6C
Figure 6D
Figure 6E

COMPACT ELECTRONIC DEVICE WITH THERMAL MANAGEMENT

RELATED APPLICATIONS

This application is a continuation of and claims priority to U.S. patent application Ser. No. 16/903,049, filed Jun. 16, 2020, titled "Compact Electronic Device with Thermal Management", which is a continuation of and claims priority to U.S. patent application Ser. No. 15/607,387, filed May 26, 2017, titled "Thermal Management for a Compact Electronic Device," now U.S. Pat. No. 10,683,962, issued on Jun. 16, 2020, which claims priority to U.S. Provisional Application Ser. No. 62/511,302, filed May 25, 2017, titled "Video Camera Assembly," each of which is incorporated by reference in its entirety.

This application is related to U.S. patent application Ser. No. 15/594,518, filed May 12, 2017, entitled "Methods and Systems for Presenting Image Data for Detected Regions of Interest"; U.S. patent application Ser. No. 15/334,172, filed Oct. 25, 2016, entitled "Method and System for Categorizing Motion Events"; and U.S. patent application Ser. No. 15/403,067, filed Jan. 10, 2017, entitled "Systems, Methods, and Devices for Managing Coexistence of Multiple Transceiver Devices Using Bypass Circuitry," each of which is hereby incorporated by reference in its entirety.

This application is also related to the following patent applications, each of which is incorporated by reference in its entirety:

U.S. patent application Ser. No. 15/607,368, filed May 26, 2017, titled "Camera Assembly Having a Single-Piece Cover Element";

U.S. patent application Ser. No. 15/607,380, filed May 26, 2017, titled "Video Camera Assembly Having an IR Reflector";

U.S. patent application Ser. No. 15/606,888, filed May 26, 2017, titled "Stand Assembly for an Electronic Device Providing Multiple Degrees of Freedom and Built-in Cables"; and U.S. Design patent application Ser. No. 29/605,503, filed May 26, 2017, titled "Camera."

TECHNICAL FIELD

This relates generally to an electronic system, including but not limited to methods and systems for passively dissipating heat generated by one or more electronic assemblies away from a heat-sensitive electronic assembly without using a fan when the electronic system has a substantially compact form factor.

BACKGROUND

A smart home environment is created by integrating a plurality of consumer electronic devices, including intelligent, multi-sensing, network-connected devices, seamlessly with each other in a local area network and/or with a central server or a cloud-computing system to provide a variety of useful smart home functions. For example, one or more network-connected cameras are often installed at a venue to provide video monitoring and security. These consumer electronic devices (e.g., the network-connected cameras) normally have compact form factors, but have to accommodate and provide strong computational and communication capabilities such that information is processed locally and provided to a remote user in real time to render satisfactory user experience. Such computational and communication capabilities cause heat to accumulate in local regions of the consumer electronic devices, and result in temperature increases that could compromise performance of heat-sensitive electronic components located in the local regions. Given their compact form factors, these consumer electronic devices cannot take advantage of many commonly applied heat dissipation mechanisms (e.g., cooling fans and heat sinks with extended fin structures). Therefore, there is a need to dissipate heat generated within a compact consumer electronic device away from any heat-sensitive assembly of the consumer electronic device.

SUMMARY

Accordingly, there is a need for a substantially compact electronic device to incorporate some heat dissipation mechanisms that dissipate heat generated within the electronic device away from a heat-sensitive assembly of the electronic device. Specifically, in accordance with some implementations of this application, the heat dissipation mechanisms passively conduct heat generated by a heat-sensitive electronic assembly and/or another heat generating electronic assembly away from the heat-sensitive electronic assembly efficiently without using a fan. Given a compact form factor of the electronic device, the heat dissipation mechanisms are also configured to mechanically support the heat-sensitive electronic assembly, the heat generating electronic assembly or both without interfering with intended functions of the electronic device.

For example, the electronic device may include an Internet-connected camera that contains a plurality of electronic assemblies in a compact housing and has various capabilities for capturing, processing and streaming video images in real time. The electronic assemblies of the camera include an image sensor assembly that is configured to capture and/or process the video image. The image sensor assembly is sensitive to heat generated by itself or by another system-on-chip (SOC) assembly. To deter a detrimental impact from the heat, two separate sets of thermally conductive parts could be used to conduct heat generated by the heat generating electronic assembly (e.g., the image sensor assembly of the camera) and/or the heat-sensitive electronic assembly (e.g., the SOC assembly of the camera) away from the heat-sensitive electronic assembly, respectively. The two separate sets of thermally conductive parts are closely disposed within the compact housing while being thermally isolated from each other.

In accordance with one embodiment, a passively-cooled electronic device includes a housing, a plurality of electronic assemblies and a first plurality of thermally conductive parts. The plurality of electronic assemblies are enclosed in the housing, and include a first electronic assembly and a second electronic assembly. The first and second electronic assemblies are disposed proximately to each other within the housing, and the second electronic assembly is substantially sensitive to heat, including heat generated by operation of the first electronic assembly. The first plurality of thermally conductive parts are coupled between the first electronic assembly and the housing, and are configured to create a first plurality of heat conduction paths to conduct the heat generated by the first electronic assembly away from the second electronic assembly without using a fan. At least a subset of the first plurality of thermally conductive parts mechanically supports one or both of the first and second electronic assemblies.

In some implementations, the electronic device further includes a second plurality of thermally conductive parts coupled between the second electronic assembly and the housing. The second plurality of thermally conductive parts are configured to create a second plurality of heat conduction paths to conduct heat on the second electronic assembly to the housing without using a fan. The second plurality of thermally conductive parts come into contact with the first plurality of thermally conductive parts via one or more separation spots that thermally separate the first and second thermally conductive parts. Further, in some implementations, the first plurality of thermally conductive parts includes a receiver structure (also called "fryer pot"). The receiver structure is disposed on top of a first surface of the first electronic assembly and configured to absorb a first part of the heat dissipated generated by the first electronic assembly. The second plurality of thermally conductive parts includes a mount structure (also called "fryer basket"). The mount structure is configured to fit into the receiver structure and support the second electronic assembly on a front-facing interior surface of the mount structure. An edge of the mount structure is separated from an edge of the receiver structure at the one or more separation spots.

In accordance with another embodiment, a camera device includes a lens assembly, a housing, a plurality of electronic assemblies and a first plurality of thermally conductive parts. The housing encloses the lens assembly. The plurality of electronic assemblies are also enclosed in the housing, and include a first electronic assembly and a second electronic assembly. The first and second electronic assemblies are disposed proximately to each other within the housing, and the second electronic assembly is substantially sensitive to heat, including heat generated by operation of the first electronic assembly. The first plurality of thermally conductive parts are coupled between the first electronic assembly and the housing, and are configured to create a first plurality of heat conduction paths to conduct the heat generated by the first electronic assembly away from the second electronic assembly without using a fan. At least a subset of the first plurality of thermally conductive parts mechanically supports one or both of the first and second electronic assemblies. In some implementations, the second electronic assembly includes an image sensor array, and the lens assembly is disposed in the mount structure in alignment with the image sensor array.

BRIEF DESCRIPTION OF THE DRAWINGS

For a better understanding of the various described implementations, reference should be made to the Description of Implementations below, in conjunction with the following drawings in which like reference numerals refer to corresponding parts throughout the figures.

FIGS. 3A and 3B are two perspective views of a camera module shown from a front side and a backside of the camera module in an exploded manner in accordance with some implementations, respectively.

FIGS. 6A-6E illustrate an example assembly process for integrating an image sensor assembly 306 in a front portion of a camera module 202 in accordance with some implementations.

Like reference numerals refer to corresponding parts throughout the several views of the drawings.

DESCRIPTION OF IMPLEMENTATIONS

Figure 1:
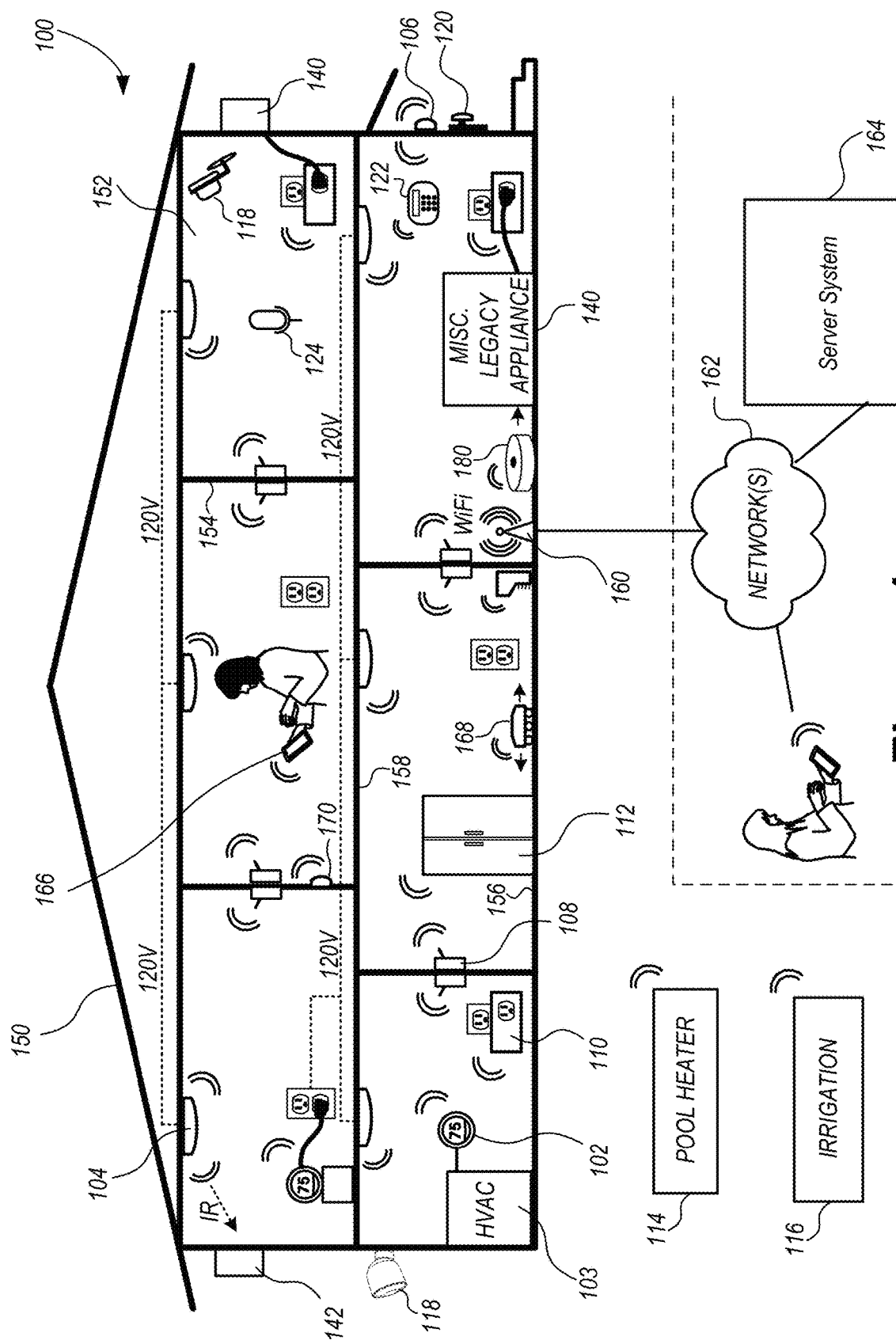
FIG. 1 is an example smart home environment in accordance with some implementations.

In accordance with various implementations of the application, a passively-cooled electronic device (e.g., an Internet-connected camera) contains a plurality of electronic assemblies and a first plurality of thermally conductive parts within a substantially compact housing. The plurality of electronic assemblies includes a first electronic assembly and a second electronic assembly that are disposed proximately to each other within the housing. The second electronic assembly (e.g., an image sensor assembly) is substantially sensitive to heat, including heat generated by operation of the first electronic assembly (e.g., an SOC assembly). The first plurality of thermally conductive parts are configured to create a first plurality of heat conduction paths to conduct the heat generated by the first electronic assembly away from the second electronic assembly without using a fan, while at least a subset of the first plurality of thermally conductive parts mechanically supports one or both of the first and second electronic assemblies. In some implementations, the first electronic assembly is configured to provide one or more processors and memory of the electronic device, and the second electronic assembly includes at least one of an image sensor array and a graphics processing unit.

In some implementations, the electronic device further includes a second plurality of thermally conductive parts thermally coupled between the second electronic assembly and the housing, and configured to create a second plurality of heat conduction paths to conduct heat on the second electronic assembly to the housing without using a fan. The second plurality of thermally conductive parts come into contact with the first plurality of thermally conductive parts via one or more separation spots that thermally separate the first and second thermally conductive parts. Specifically, in some implementations, the first plurality of thermally conductive parts includes a receiver structure (e.g., having a shape like that of a fryer pot) disposed on top of a first surface of the first electronic assembly and configured to absorb a first part of the heat dissipated generated by the first electronic assembly. The second plurality of thermally conductive parts includes a mount structure (e.g., having a shape like that of a fryer basket) configured to fit into the receiver structure and support the second electronic assembly on a front-facing interior surface of the mount structure. An edge of the mount structure is separated from an edge of the receiver structure at the one or more separation spots.

Further, in some implementations, the one or more separation spots are equally distributed on the respective edge of each of the receiver structure and the mount structure. In some implementations, a bottom exterior surface of the mount structure is separated from a bottom interior surface of the receiver structure by an air gap. Alternatively, in some implementations, a bottom exterior surface of the mount structure is separated from a bottom interior surface of the receiver structure by a piece of solid thermal insulator. In some implementations, a bottom exterior surface of the receiver structure is coupled to the first surface of the first electronic assembly via one or more first thermal pads that are disposed on one or more hot spots of the first electronic assembly. In some implementations, the electronic device further includes one or more second thermal pads configured to physically and thermally couple a peripheral exterior surface of the receiver structure to an interior surface of the housing. The one or more second thermal pads is configured to conduct the first part of the heat generated by the first electronic assembly from the receiver structure to the housing of the electronic device in accordance with a first heat conduction path of the first plurality of heat conduction paths.

Additionally, in some implementations, the first plurality of thermally conductive parts includes a speaker box thermally coupled to a second surface of the first electronic assembly via a thermally conductive sheet. The speaker box is configured to absorb and conduct a second part of heat generated by the first electronic assembly in accordance with a second heat conduction path of the first plurality of heat conduction paths. In some implementations, at least part of the speaker box is made of a thermal plastic material configured to absorb and conduct the second part of heat generated by the first electronic assembly. Optionally, the thermally conductive sheet is made of graphite. In some implementations, one or more antennas are attached to an exterior surface of the speaker box and contained within the housing. The thermally conductive sheet optionally includes a cut substantially near a center of the thermally conductive sheet, and the cut has a width that is less than a threshold cut width thereby reducing crosstalk among the one or more antennas below a threshold crosstalk level.

In some implementations, the electronic device further includes a second plurality of thermally conductive parts thermally coupled between the second electronic assembly and the housing. The second plurality of thermally conductive parts include a mount structure configured to support the second electronic assembly when a first surface of the second electronic assembly sits on a front-facing interior surface of the mount structure, and the mount structure is configured to at least partially absorb and conduct heat generated by the second electronic assembly in accordance with a third heat conduction path of the second plurality of heat conduction paths.

Further, in some implementations, the second plurality of thermally conductive parts further includes a front thermal dissipater attached on a front interior surface of the housing and opposite the front-facing interior surface of the mount structure. The front-facing interior surface of the mount structure is thermally coupled to the front thermal dissipater via one or more third thermal pads. The front thermal dissipater is configured to at least partially absorb and conduct the heat generated by the second electronic assembly in accordance with a fourth heat conduction path of the second plurality of heat conduction paths. In some implementations, a front portion of the housing is covered by a cover glass (which is regarded as part of the housing), and the front thermal dissipater is attached to the cover glass. In some implementations, the mount structure is disposed in contact with the front thermal dissipater, and thermally coupled to the front thermal dissipater.

In some implementations, the second electronic assembly includes an image sensor array, and a lens assembly is disposed in the mount structure in alignment with the image sensor array. Further, in some implementations, the front thermal dissipater includes an opening configured to expose the lens assembly and the image sensor array to incoming visible or infrared light.

The foregoing description, for purpose of explanation, has been described with reference to specific implementations of Internet-connected cameras. However, the illustrative discussions below are not intended to be exhaustive or to limit the scope of the claims to the precise forms disclosed. Many modifications and variations are possible in view of the following teachings. The implementations were chosen in order to best explain the principles underlying the claims and their practical applications, to thereby enable others skilled in the art to best use the implementations with various modifications as are suited to the particular uses contemplated.

Reference is made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, mechanical structures, circuits, and networks have not been described in detail so as not to unnecessarily obscure aspects of the implementations.

FIG. 1 is an example smart home environment 100 in accordance with some implementations. The smart home environment 100 includes a structure 150 (e.g., a house, office building, garage, or mobile home) with various integrated devices. It will be appreciated that devices may also be integrated into a smart home environment 100 that does not include an entire structure 150, such as an apartment, condominium, or office space. Further, the smart home environment 100 may control and/or be coupled to devices outside of the actual structure 150. Indeed, several devices in the smart home environment 100 need not be physically within the structure 150. For example, a device controlling a pool heater 114 or irrigation system 116 may be located outside of the structure 150.

It is to be appreciated that "smart home environments" may refer to smart environments for homes such as a single-family house, but the scope of the present teachings is not so limited. The present teachings are also applicable, without limitation, to duplexes, townhomes, multi-unit apartment buildings, hotels, retail stores, office buildings, industrial buildings, and more generally any living space or work space.

It is also to be appreciated that while the terms user, customer, installer, homeowner, occupant, guest, tenant, landlord, repair person, and the like may be used to refer to the person or persons acting in the context of some particularly situations described herein, these references do not limit the scope of the present teachings with respect to the person or persons who are performing such actions. Thus, for example, the terms user, customer, purchaser, installer, subscriber, and homeowner may often refer to the same person in the case of a single-family residential dwelling, because the head of the household is often the person who makes the purchasing decision, buys the unit, and installs and configures the unit, and is also one of the users of the unit. However, in other scenarios, such as a landlord-tenant environment, the customer may be the landlord with respect to purchasing the unit, the installer may be a local apartment supervisor, a first user may be the tenant, and a second user may again be the landlord with respect to remote control functionality. Importantly, while the identity of the person performing the action may be germane to a particular advantage provided by one or more of the implementations, such identity should not be construed in the descriptions that follow as necessarily limiting the scope of the present teachings to those particular individuals having those particular identities.

The depicted structure 150 includes a plurality of rooms 152, separated at least partly from each other via walls 154. The walls 154 may include interior walls or exterior walls. Each room may further include a floor 156 and a ceiling 158. Devices may be mounted on, integrated with and/or supported by a wall 154, floor 156 or ceiling 158.

In some implementations, the integrated devices of the smart home environment 100 include intelligent, multi-sensing, network-connected devices that integrate seamlessly with each other in a smart home network and/or with a central server or a cloud-computing system server system 164 to provide a variety of useful smart home functions. The smart home environment 100 may include one or more intelligent, multi-sensing, network-connected thermostats 102 (hereinafter referred to as "smart thermostats 102"), one or more intelligent, network-connected, multi-sensing hazard detection units 104 (hereinafter referred to as "smart hazard detectors 104"), one or more intelligent, multi-sensing, network-connected entryway interface devices 106 and 120 (hereinafter referred to as "smart doorbells 106" and "smart door locks 120"), and one or more intelligent, multi-sensing, network-connected alarm systems 122 (hereinafter referred to as "smart alarm systems 122").

In some implementations, the one or more smart thermostats 102 detect ambient climate characteristics (e.g., temperature and/or humidity) and control a HVAC system 103 accordingly. For example, a respective smart thermostat 102 includes an ambient temperature sensor.

The one or more smart hazard detectors 104 may include thermal radiation sensors directed at respective heat sources (e.g., a stove, oven, other appliances, a fireplace, etc.). For example, a smart hazard detector 104 in a kitchen 153 includes a thermal radiation sensor directed at a stove/oven 112. A thermal radiation sensor may determine the temperature of the respective heat source (or a portion thereof) at which it is directed and may provide corresponding blackbody radiation data as output.

The smart doorbell 106 and/or the smart door lock 120 may detect a person's approach to or departure from a location (e.g., an outer door), control doorbell/door locking functionality (e.g., receive user inputs from a portable electronic device 166-1 to actuate bolt of the smart door lock 120), announce a person's approach or departure via audio or visual means, and/or control settings on a security system (e.g., to activate or deactivate the security system when occupants go and come). In some implementations, the smart doorbell 106 includes some or all of the components and features of the camera 118. In some implementations, the smart doorbell 106 includes a camera 118.

The smart alarm system 122 may detect the presence of an individual within close proximity (e.g., using built-in IR sensors), sound an alarm (e.g., through a built-in speaker, or by sending commands to one or more external speakers), and send notifications to entities or users within/outside of the smart home network 100. In some implementations, the smart alarm system 122 also includes one or more input devices or sensors (e.g., keypad, biometric scanner, NFC transceiver, microphone) for verifying the identity of a user, and one or more output devices (e.g., display, speaker). In some implementations, the smart alarm system 122 may also be set to an "armed" mode, such that detection of a trigger condition or event causes the alarm to be sounded unless a disarming action is performed.

In some implementations, the smart home environment 100 includes one or more intelligent, multi-sensing, network-connected wall switches 108 (hereinafter referred to as "smart wall switches 108"), along with one or more intelligent, multi-sensing, network-connected wall plug interfaces 110 (hereinafter referred to as "smart wall plugs 110"). The smart wall switches 108 may detect ambient lighting conditions, detect room-occupancy states, and control a power and/or dim state of one or more lights. In some instances, smart wall switches 108 may also control a power state or speed of a fan, such as a ceiling fan. The smart wall plugs 110 may detect occupancy of a room or enclosure and control supply of power to one or more wall plugs (e.g., such that power is not supplied to the plug if nobody is at home).

In some implementations, the smart home environment 100 of FIG. 1 includes a plurality of intelligent, multi-sensing, network-connected appliances 112 (hereinafter referred to as "smart appliances 112"), such as refrigerators, stoves, ovens, televisions, washers, dryers, lights, stereos, intercom systems, garage-door openers, floor fans, ceiling fans, wall air conditioners, pool heaters, irrigation systems, security systems, space heaters, window AC units, motorized duct vents, and so forth. In some implementations, when plugged in, an appliance may announce itself to the smart home network, such as by indicating what type of appliance it is, and it may automatically integrate with the controls of the smart home. Such communication by the appliance to the smart home may be facilitated by either a wired or wireless communication protocol. The smart home may also include a variety of non-communicating legacy appliances 140, such as old conventional washer/dryers, refrigerators, and the like, which may be controlled by smart wall plugs 110. The smart home environment 100 may further include a variety of partially communicating legacy appliances 142, such as infrared ("IR") controlled wall air conditioners or other IR-controlled devices, which may be controlled by IR signals provided by the smart hazard detectors 104 or the smart wall switches 108.

In some implementations, the smart home environment 100 includes one or more network-connected cameras 118 that are configured to provide video monitoring and security in the smart home environment 100. The cameras 118 may be used to determine occupancy of the structure 150 and/or particular rooms 152 in the structure 150, and thus may act as occupancy sensors. For example, video captured by the cameras 118 may be processed to identify the presence of an occupant in the structure 150 (e.g., in a particular room 152). Specific individuals may be identified based, for example, on their appearance (e.g., height, face) and/or movement (e.g., their walk/gait). Cameras 118 may additionally include one or more sensors (e.g., IR sensors, motion detectors), input devices (e.g., microphone for capturing audio), and output devices (e.g., speaker for outputting audio). In some implementations, the cameras 118 are each configured to operate in a day mode and in a low-light mode (e.g., a night mode). In some implementations, the cameras 118 each include one or more IR illuminators for providing illumination while the camera is operating in the low-light mode. In some implementations, the cameras 118 include one or more outdoor cameras. In some implementations, the outdoor cameras include additional features and/or components such as weatherproofing and/or solar ray compensation.

The smart home environment 100 may additionally or alternatively include one or more other occupancy sensors (e.g., the smart doorbell 106, smart door locks 120, touch screens, IR sensors, microphones, ambient light sensors, motion detectors, smart nightlights 170, etc.). In some implementations, the smart home environment 100 includes radio-frequency identification (RFID) readers (e.g., in each room 152 or a portion thereof) that determine occupancy based on RFID tags located on or embedded in occupants. For example, RFID readers may be integrated into the smart hazard detectors 104. The smart home environment 100 may include one or more sound and/or vibration sensors (e.g., microphone 124) for detecting sounds and/or vibrations. These sensors may stand alone or be integrated with any of the devices described above. Optionally, the sound sensors detect sound above a decibel threshold. Optionally, the vibration sensors detect vibration above a threshold directed at a particular area (e.g., vibration on a particular window when a force is applied to break the window).

The smart home environment 100 may also include communication with devices outside of the physical home but within a proximate geographical range of the home. For example, the smart home environment 100 may include a pool heater monitor 114 that communicates a current pool temperature to other devices within the smart home environment 100 and/or receives commands for controlling the pool temperature. Similarly, the smart home environment 100 may include an irrigation monitor 116 that communicates information regarding irrigation systems within the smart home environment 100 and/or receives control information for controlling such irrigation systems.

By virtue of network connectivity, one or more of the smart home devices of FIG. 1 may further allow a user to interact with the device even if the user is not proximate to the device. For example, a user may communicate with a device using a computer (e.g., a desktop computer, laptop computer, or tablet) or other portable electronic device 166 (e.g., a mobile phone, such as a smart phone). A webpage or application may be configured to receive communications from the user and control the device based on the communications and/or to present information about the device's operation to the user. For example, the user may view a current set point temperature for a device (e.g., a stove) and adjust it using a computer. The user may be in the structure during this remote communication or outside the structure.

As discussed above, users may control smart devices in the smart home environment 100 using a network-connected computer or portable electronic device 166. In some examples, some or all of the occupants (e.g., individuals who live in the home) may register their device 166 with the smart home environment 100. Such registration may be made at a central server (e.g., a server system 164) to authenticate the occupant and/or the device as being associated with the home and to give permission to the occupant to use the device to control the smart devices in the home.

An occupant may use their registered device 166 to remotely control the smart devices of the home, such as when the occupant is at work or on vacation. The occupant may also use their registered device to control the smart devices when the occupant is actually located inside the home, such as when the occupant is sitting on a couch inside the home. It should be appreciated that instead of or in addition to registering devices 166, the smart home environment 100 may make inferences about which individuals live in the home and are therefore occupants and which devices 166 are associated with those individuals. As such, the smart home environment may "learn" who is an occupant and permit the devices 166 associated with those individuals to control the smart devices of (e.g., the cameras 118) the home.

In some implementations, in addition to containing processing and sensing capabilities, devices 102, 104, 106, 108, 110, 112, 114, 116, 118, 120, and/or 122 (collectively referred to as "the smart devices") are capable of data communications and information sharing with other smart devices, a central server or cloud-computing system, and/or other devices that are network-connected. Data communications may be carried out using any of a variety of custom or standard wireless protocols (e.g., IEEE 802.15.4, Wi-Fi, ZigBee, 6LoWPAN, Thread, Z-Wave, Bluetooth Smart, ISA100.5A, WirelessHART, MiWi, etc.) and/or any of a variety of custom or standard wired protocols (e.g., Ethernet, HomePlug, etc.), or any other suitable communication protocol, including communication protocols not yet developed as of the filing date of this document.

In some implementations, the smart devices serve as wireless or wired repeaters. In some implementations, a first one of the smart devices communicates with a second one of the smart devices via a wireless router. The smart devices may further communicate with each other via a connection (e.g., network interface 160) to a network, such as the Internet 162. Through the Internet 162, the smart devices may communicate with a server system 164 (also called a central server system and/or a cloud-computing system herein). The server system 164 may be associated with a manufacturer, support entity, or service provider associated with the smart device(s). In some implementations, a user is able to contact customer support using a smart device itself rather than needing to use other communication means, such as a telephone or Internet-connected computer. In some implementations, software updates are automatically sent from the server system 164 to smart devices (e.g., when available, when purchased, or at routine intervals).

In some implementations, the network interface 160 includes a conventional network device (e.g., a router), and the smart home environment 100 of FIG. 1 includes a hub device 180 that is communicatively coupled to the network(s) 162 directly or via the network interface 160. The hub device 180 is further communicatively coupled to one or more of the above intelligent, multi-sensing, network-connected devices (e.g., smart devices of the smart home environment 100). Each of these smart devices optionally communicates with the hub device 180 using one or more radio communication networks available at least in the smart home environment 100 (e.g., ZigBee, Z-Wave, Insteon, Bluetooth, Wi-Fi and other radio communication networks). In some implementations, the hub device 180 and devices coupled with/to the hub device can be controlled and/or interacted with via an application running on a smart phone, household controller, laptop, tablet computer, game console or similar electronic device. In some implementations, a user of such controller application can view status of the hub device or coupled smart devices, configure the hub device to interoperate with smart devices newly introduced to the home network, commission new smart devices, and adjust or view settings of connected smart devices, etc. In some implementations the hub device extends capabilities of low capability smart device to match capabilities of the highly capable smart devices of the same type, integrates functionality of multiple different device types—even across different communication protocols, and is configured to streamline adding of new devices and commissioning of the hub device. In some implementations, hub device 180 further comprises a local storage device for storing data related to, or output by, smart devices of smart home environment 100. In some implementations, the data includes one or more of: video data output by a camera device, metadata output by a smart device, settings information for a smart device, usage logs for a smart device, and the like.

In some implementations, smart home environment 100 includes a local storage device for storing data related to, or output by, smart devices of smart home environment 100. In some implementations, the data includes one or more of: video data output by a camera device (e.g., camera 118), metadata output by a smart device, settings information for a smart device, usage logs for a smart device, and the like. In some implementations, the local storage device is communicatively coupled to one or more smart devices via a smart home network. In some implementations, the local storage device is selectively coupled to one or more smart devices via a wired and/or wireless communication network. In some implementations, the local storage device is used to store video data when external network conditions are poor. For example, the local storage device is used when an encoding bitrate of camera 118 exceeds the available bandwidth of the external network (e.g., network(s) 162). In some implementations, the local storage device temporarily stores video data from one or more cameras (e.g., camera 118) prior to transferring the video data to a server system (e.g., server system 164).

Figure 2B:
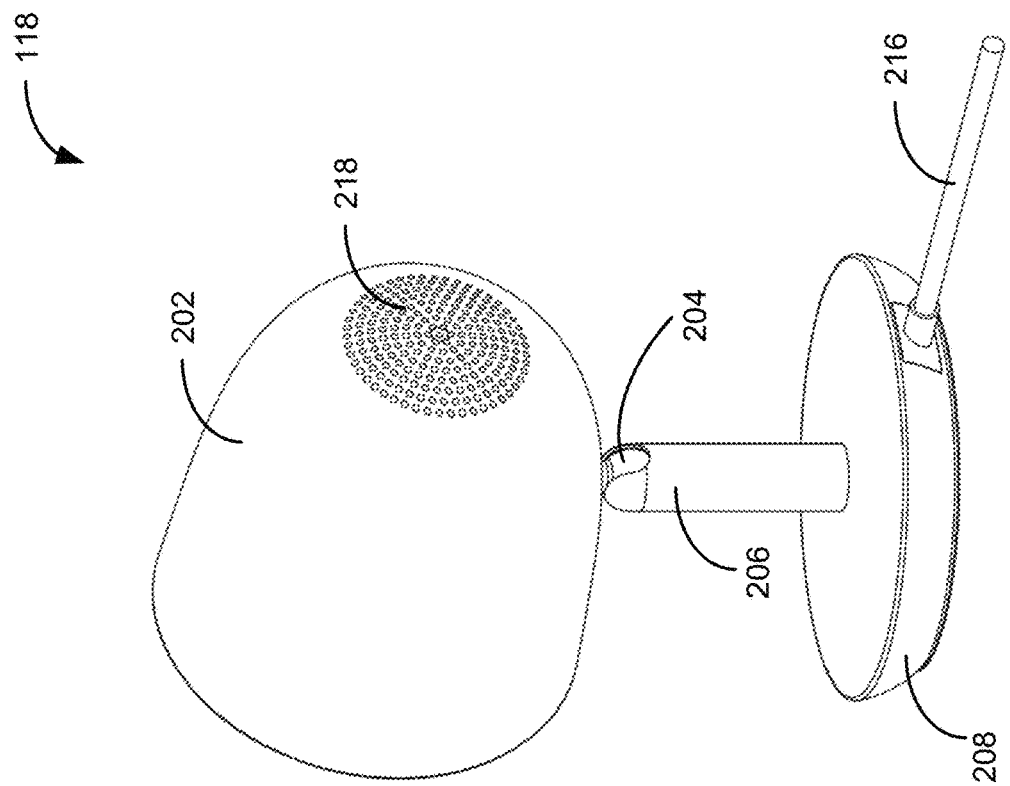
FIGS. 2A and 2B are two perspective views of a camera showing a front side and a backside of the camera in accordance with some implementations, respectively.
Figure 2A:
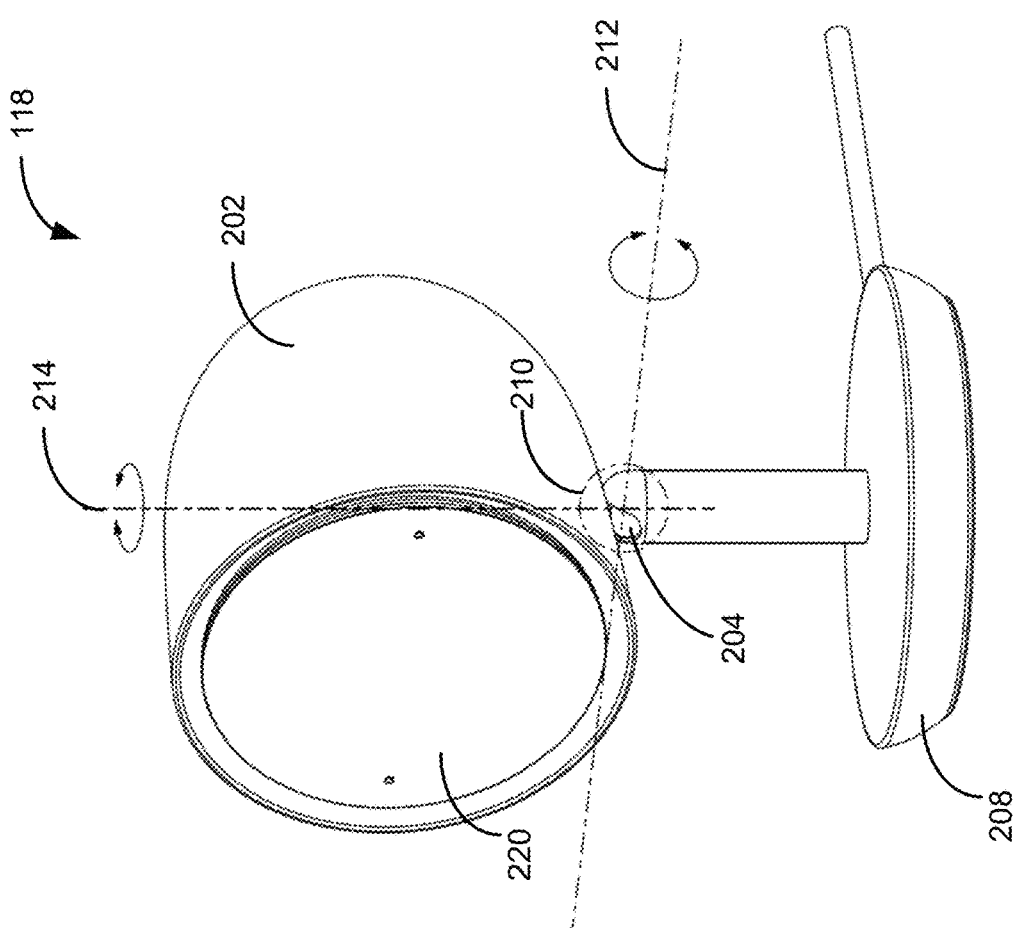

FIGS. 2A and 2B are two perspective views of a camera 118 showing a front side and a backside of the camera 118 in accordance with some implementations, respectively. The camera 118 includes a camera module 202, a neck portion 204, a spine portion 206 and a base 208. The neck portion 204 has a first end that holds and extends from the camera module 202. The spine portion 206 is coupled via a joint structure 210 to a second end of the neck portion 204 opposing the first end of the neck portion 204. The base 208 is shaped to rest against a supporting surface. The spin portion 206 extends from and is fixed onto the base 208.

The neck portion 204, the spine portion 206, the joint structure 210, and the base 208 together are configured to support the camera module 202 while providing one or more degrees of freedom of motion for the camera module 202. Specifically, in some implementations, the joint structure 210 is configured to provide a first rotational degree of freedom of the neck portion 204 with respect to the spine portion 206. The first rotational degree of freedom of the joint structure is associated with flipping of the neck portion 202 and the camera module 202 with respect to a first axis of rotation 212, and the first axis of rotation 212 is substantially parallel to a planar surface of the base 208 that is shaped to rest against the supporting surface. Additionally, in some implementations, the camera module 202 is configured to rotate at a second rotational degree of freedom with respect to the neck portion 204 by itself, and rotation of the camera module 202 at the second rotational degree of freedom has a second axis of rotation 214 that is aligned with a central axis of the neck portion 204. Referring to FIG. 2A, when the neck and spine portions 204 and 206 are aligned and when the camera module 202 is rotated to a nominal position at the second degree of freedom of rotation, the camera module 202 is configured to face towards a nominal direction. The first and second rotational degrees of freedom define one or more angles of view for a field of view of the camera 118 with reference to the nominal position of the camera module 202.

In some implementations, the base 208 further includes an electronic connector (not shown in FIGS. 2A and 2B), and the electronic connector is exposed from a rim side of the base 208 and inset into a body of the base 210. The electronic connector is configured to receive one or more external interconnect wires 216 that could electrically couple the camera 118 to an external power supply or other electronic devices to transfer power and/or data. In some implementations not shown in FIGS. 2A and 2B, one or more internal interconnect wires are electrically coupled to the electronic connector, and routed through an interior of the base 208, the spine portion 206, the joint structure 212, and the neck portion 204 to couple the camera module 202 to the external power supply or other electronic devices. Thus, in some implementations, when the camera 118 is coupled to an external interconnect wire 216, the electronic connector and the one or more internal interconnect wires are entirely concealed within the camera 118.

In some implementations, the camera module 202 is configured to capture video and send video data to a video server system substantially in real-time. In some implementations, the camera module 202 optionally includes a controller device (not shown) that serves as an intermediary between the camera 118 and the video server system. The controller device receives the video data from the camera 118, optionally performs some preliminary processing on the video data, and sends the video data to the video server system on behalf of the camera 118 substantially in real-time. In some implementations, the camera module 202 of the camera 118 has its own on-board processing capabilities to perform some preliminary processing on the captured video data before sending the processed video data (along with metadata obtained through the preliminary processing) to the controller device and/or the video server system. For example, in some implementations, the camera module 202 captures video at a first resolution (e.g., 720P and/or 1080P) and/or a first frame rate (24 frames per second), creates video data at a second, different resolution (e.g., 180P) and/or a second frame rate (e.g., 5 frames per second or 10 frames per second), and sends the captured video to the video server system 208 at both the first resolution (e.g., the original capture resolution(s), the high-quality resolution(s) such as 1080P and/or 720P) and the first frame rate, and at the second resolution (e.g., the processed resolution, the low-quality resolution such as 180P) and/or the second frame rate.

The camera 118 communicates with one or more client devices and a video server system using the one or more communication networks 162. Examples of the one or more networks include local area networks (LAN) and wide area networks (WAN) such as the Internet. The one or more networks 162 are, optionally, implemented using any known network protocol, including various wired or wireless protocols, such as Ethernet, Universal Serial Bus (USB), FIRE-WIRE, Long Term Evolution (LTE), Global System for Mobile Communications (GSM), Enhanced Data GSM Environment (EDGE), code division multiple access (CDMA), time division multiple access (TDMA), Bluetooth, Wi-Fi, voice over Internet Protocol (VoIP), Wi-MAX, or any other suitable communication protocol.

In some implementations, a video server system is, or includes, a dedicated video processing server configured to provide data processing for monitoring and facilitating review of alert events (e.g., motion events) in video streams captured by one or more cameras 118. In this situation, the video server system receives video data from cameras 118 located at various physical locations (e.g., inside homes, restaurants, stores, streets, parking lots, and/or the smart home environments 100 of FIG. 1). Each camera 118 may be bound to one or more user (e.g., reviewer) accounts, and the video server system provides video monitoring data for the camera 118 to client devices (e.g., mobile phones or tablet computers) associated with the reviewer accounts.

The camera module 202 includes a housing that encloses at least a lens assembly associated with an image sensor assembly performance of which is sensitive to heat. A front portion of the housing is covered by a cover glass 220. The lens assembly is disposed within the front portion, and configured to receive light that penetrates the cover glass 220. A speaker is disposed within a rear portion of the housing opposing the front portion of the housing. A rear surface of the housing has a plurality of holes 218 coupled to the speaker and configured for delivering voice messages or other audio. For example, the speaker may allow a person viewing video from the camera 118 to talk to someone being filmed by the camera 118, play music back, etc. In accordance with various implementations of this application, the speaker of the camera module 202 is used as a heat sink, and forms part of a heat conduction path for conducting heat away from the image sensor assembly.

FIGS. 3A and 3B are two perspective views of a camera module 202 shown from a front side and a backside of the camera module 202 in an exploded manner in accordance with some implementations, respectively. As explained above, the camera module 202 includes a housing 302 that encloses a lens assembly 304 associated with an image sensor assembly 306. The lens assembly 304 is configured to focus incident visible light on the image sensor assembly 306, which captures respective color components (e.g., R, G and B components) of the incident light focused on respective sensor array locations. The image sensor assembly 306 optionally processes the captured video data. The image sensor assembly 306 includes an image sensor array.

In some implementations, the camera module 202 includes a system on chip (SOC) assembly 308 that has one or more processing units or controllers (e.g., CPUs, ASICs, FPGAs, microprocessors, and the like), one or more communication interfaces, memory, one or more communication buses for interconnecting these components (sometimes called a chipset). The communication interfaces in the SOC assembly 308 include, for example, hardware capable of data communications using any of a variety of custom or standard wireless protocols (e.g., IEEE 402.15.4, Wi-Fi, ZigBee, 6LoWPAN, Thread, Z-Wave, Bluetooth Smart, ISA100.11a, WirelessHART, MiWi, etc.) and/or any of a variety of custom or standard wired protocols (e.g., Ethernet, HomePlug, etc.), or any other suitable communication protocol, including communication protocols not yet developed as of the filing date of this document. The memory in the SOC assembly 308 includes high-speed random access memory, such as DRAM, SRAM, DDR RAM, or other random access solid state memory devices; and, optionally, includes non-volatile memory, such as one or more magnetic disk storage devices, one or more optical disk storage devices, one or more flash memory devices, or one or more other non-volatile solid state storage devices. Memory, or alternatively the non-volatile memory within memory, includes a non-transitory computer readable storage medium. In some implementations, memory, or the non-transitory computer readable storage medium of memory, stores the programs, modules, and data structures for enabling image capturing, data processing and communication capabilities of the camera 118. Operations of these computational, storage or communication components in the SOC assembly 308 generate heat that needs to be directed away from the heat-sensitive image sensor assembly 306.

In some implementations, the camera module 202 includes one or more input devices such as one or more buttons for receiving input and one or more microphones. In some implementations, the camera module 202 includes one or more output devices, such as one or more indicator lights, a sound card, a speaker 310, and a small display for displaying textual information and error codes, playing audio, etc.

In some implementations, the camera module 202 operates in one of two modes (e.g., a Day mode and a Nighttime mode) depending on the ambient lighting conditions. Day mode is used when there is sufficient ambient light to adequately illuminate the scene. Nighttime mode is used when there is not enough light to adequately illuminate the scene. In some implementations, when operating in Day mode, the camera 118 uses the ambient lighting sources to illuminate the scene and capture surveillance video. In some implementations, the minimum lux level at which the camera 118 captures video in Day mode is between 0.1 to 1 lux depending on the color temperature of the dominant illuminant. Once the minimum lux level is reached, the camera automatically switches to Night mode. Switching to Night mode includes disabling a filter (not shown) and enabling a set of infrared illuminators (e.g., infrared light emitting diodes (IR LEDs)) 312 to provide illumination for the scene. Night mode is maintained until the camera 118 detects an external illuminant.

Specifically, in some implementations, when the camera is in the Day mode, a filter is enabled for blocking a substantial portion of the IR components of the incident light. Alternatively, when the camera is in the Nighttime mode, the filter is disabled, allowing the image sensor assembly 306 to receive incident IR light from a scene illuminated by the camera's onboard IR illuminators 312 or external IR illuminators.

In accordance with various implementations of this application, the camera module 202 is passively cooled down because the housing 302 is substantially compact and may not readily accommodate a fan. The image sensor assembly 306 and the SOC assembly 308 are disposed proximately to each other within the housing 302, while the image sensor assembly 306 is substantially sensitive to heat (including but not limited to heat generated by operation of the SOC assembly 308). The camera module 202 is configured to include a first plurality of thermally conductive parts, such as the speaker 310, a thermally conductive sheet 330, a receiver structure 314 and one or more thermal pads 316. The first plurality of thermally conductive parts create a first plurality of heat conduction paths to conduct the heat generated by the SOC assembly 308 away from the image sensor assembly 306 without using a fan. At least a subset of the first plurality of thermally conductive parts mechanically supports the image sensor assembly 306 and/or the SOC assembly 308 within the housing 302.

In some implementations, the camera module 202 further includes a second plurality of thermally conductive parts, such as a mount structure 320 and a front thermal dissipater 322. In some implementations, the receiver structure 314 has a shape like that of a fryer pot, and the mount structure 320 has a shape like that of a fryer basket, such that the mount structure 320 could fit into the receiver structure 314 and enable a compact form factor of the camera module 302. More details of the receiver and mount structures are explained below with reference to FIGS. 4, 7, and 8.

The front thermal dissipater 322 is attached to the cover glass 220 of the camera module 202. Optionally, the cover glass 220 is regarded as part of the housing 302 when it is assembled onto the housing 302. The second plurality of thermally conductive parts are configured to create a second plurality of heat conduction paths to conduct heat from the image sensor assembly 306 (which is sensitive to heat) to the housing 302 and/or the cover glass 220 without using a fan. The first and second of plurality of conductive parts are disposed closely to each other within the camera module 202, and come into contact with each other via one or more insulator pads 324 that thermally separate the first and second thermally conductive parts at one or more separation spots 326. Optionally, the first plurality of thermally conductive parts are thermally insulated from the second plurality of thermally conductive parts via an air gap or a piece of solid thermal insulator 328. Each of the one or more separation spots 326 and solid thermal insulator 328 has a substantially low thermal conductivity that is less than a thermal conductivity threshold. In one example, the thermal conductivity threshold is set at 0.05 W/(K·m), and the solid thermal insulator 328 includes a foam insulation layer having a thermal conductivity of 0.018 W/(K·m).

Figure 4:
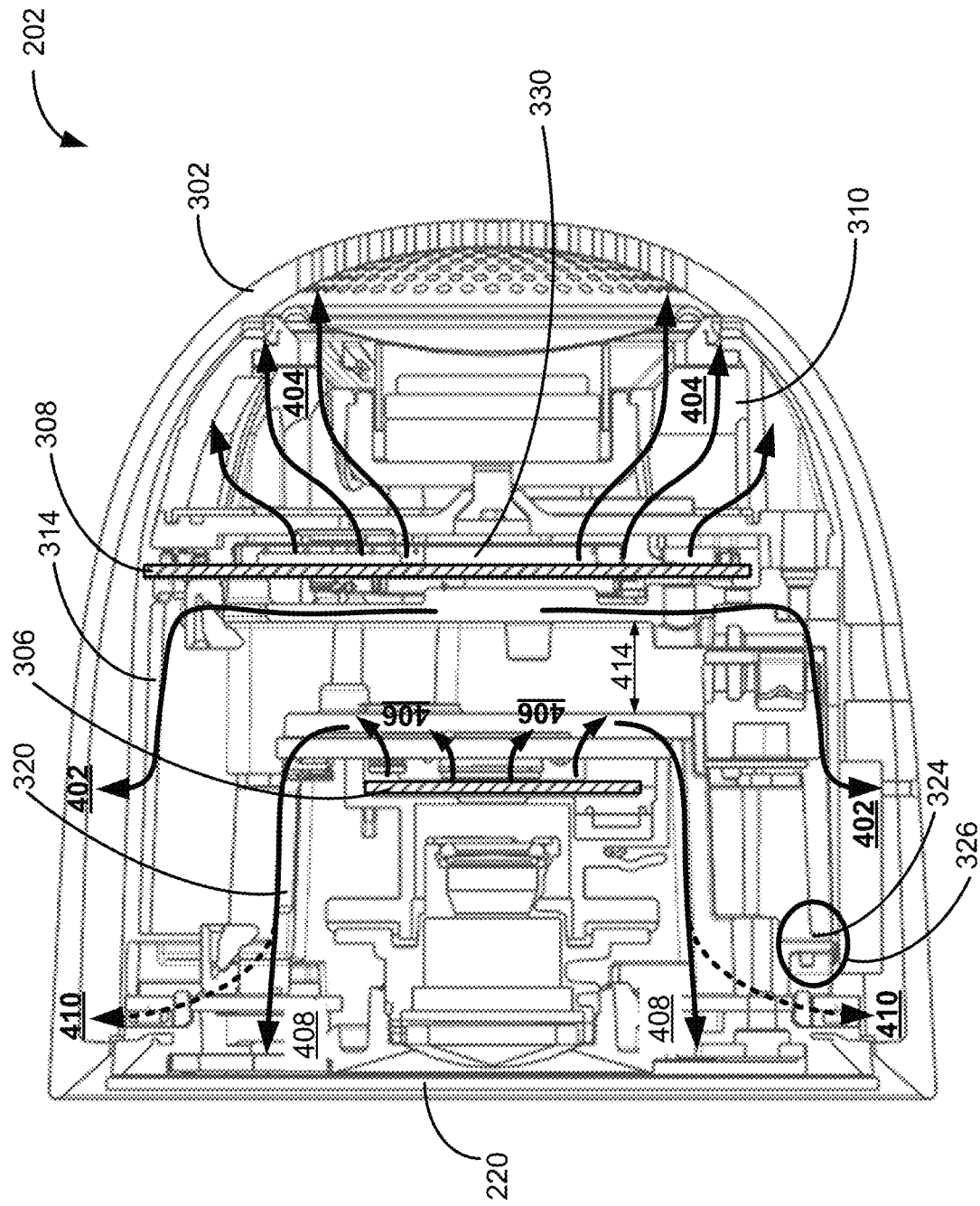
FIG. 4 is a cross-sectional view of a camera module shown in FIGS. 2A-2B and 3A-3B in accordance with some implementations.

FIG. 4 is a cross-sectional view of a camera module 202 shown in FIGS. 2A-2B and 3A-3B in accordance with some implementations. In this example camera module 202, a lens assembly 304, an image sensor assembly 306, an SOC assembly 308, a first plurality of thermally conductive parts and a second plurality of thermally conductive parts are disposed proximally to each other within a housing 302 that is covered by a cover glass 220 at its front. Optionally, the cover glass 220 is regarded as part of the housing 302. In an example, the image sensor assembly 306 and the SOC assembly 308 are positioned substantially in parallel with each other. The SOC assembly 308 is surrounded by the first plurality of thermally conductive parts that mechanically support the SOC assembly 308 within the housing 302. The first plurality of thermally conductive parts thermally couple the SOC assembly 308 to an interior surface of the housing 302, i.e., create a first plurality of heat conduction paths to conduct the heat generated by the SOC assembly 308 to the housing 302 and away from the image sensor assembly 306.

Specifically, in some implementations, the first plurality of thermally conductive parts includes a receiver structure 314 and a speaker box 310, and the SOC assembly 308 is sandwiched between the receiver structure 314 and the speaker box 310. The receiver structure 314 is disposed on top of a first surface of the SOC assembly 308 and configured to absorb a first part of the heat generated by the SOC assembly 308. One or more thermal pads 316 physically and thermally couple a peripheral exterior surface of the receiver structure 314 to an interior surface of the housing 302. Thus, the first part of the heat generated by the SOC assembly 308 is conducted from the receiver structure 314 to the housing 302 of the camera module 202 in accordance with a first heat conduction path 402 of the first plurality of heat conduction paths. In addition, the speaker box 310 is thermally coupled to a second surface of the SOC assembly 308 via a thermally conductive sheet 330. The speaker box 310 is configured to absorb and conduct a second part of the heat generated by the SOC assembly 308 in accordance with a second heat conduction path 404 of the first plurality of heat conduction paths.

The image sensor assembly 306 faces the cover glass 220, and a lens assembly 304 is disposed between the cover glass 220 and the image sensor assembly 306. The lens assembly 304 is aligned with the image sensor assembly 306 and configured to create a light path for incident light. The image sensor assembly 306 captures video data when the light travels along the light path and reaches the image sensor assembly 306. The image sensor assembly 306 is surrounded by the second plurality of thermally conductive parts and the lens assembly 304. The second plurality of thermally conductive parts at least partially support the image sensor assembly 304 within the housing 302. More importantly, while leaving the light path for the incident light open, the second plurality of thermally conductive parts thermally couple the image sensor array 306 to the housing 302 (e.g., the cover glass 220 or a peripheral interior surface of the housing 302). Stated another way, the second plurality of thermally conductive parts create a second plurality of heat conducting heat conduction paths to conduct heat from the image sensor assembly 306 to the housing 302. The heat from the image sensor assembly 306 includes heat generated by the image sensor assembly 306 itself and/or heat transferred to the image sensor assembly 306 by any other part packaged in the housing 302.

Specifically, in some implementations, the second plurality of thermally conductive parts includes a mount structure 320. The mount structure 320 supports the image sensor assembly 306 at its front-facing interior surface and holds the lens assembly 304 that is disposed in alignment with the image sensor assembly 306. The mount structure 320 is configured to fit into the receiver structure 314 together with the image sensor assembly 306 and the lens assembly 304. The mount structure 320 is configured to at least partially absorb and conduct heat generated by the second electronic assembly in accordance with a third heat conduction path 406 of the second plurality of heat conduction paths. In some situations, a front thermal dissipater 322 is attached on a front interior surface of the housing 302 (i.e., a rear surface of the cover glass 220) opposing the front-facing interior surface of the mount structure 320. The mount structure 320 is thermally coupled to the front thermal dissipater 322 via one or more thermal pads, and therefore, the mount structure 320 and the front thermal dissipater 322 at least partially absorb and conduct the heat generated by the image sensor assembly 306 in accordance with a fourth heat conduction path 408 of the second plurality of heat conduction paths. Alternatively, in some situations, an edge of the mount structure 320 extends to and comes into contact with an interior surface of the housing 302, and the mount structure 320 dissipates the part of heat absorbed from the image sensor assembly 306 to the housing 302 directly in accordance with a fifth heat conduction path 410 of the second plurality of heat conduction paths.

The second plurality of thermally conductive parts come into contact with the first plurality of thermally conductive parts via one or more insulator pads 324 that thermally separate the first and second thermally conductive parts at one or more separation spots 326. Specifically, while sitting within the receiver structure 314, the mount structure 320 comes into contact with the mount structure 320 via one or more insulator pads 324, which thereby thermally insulate the first and second thermally conductive parts at the one or more separation spots 326. More specifically, in some implementations, an edge of the mount structure 320 is separated from an edge of the receiver structure 314 at the one or more separation spots 326. Alternatively, in some implementations, the first plurality of thermally conductive parts is thermally insulated from the second plurality of thermally conductive parts by an air gap 414 or a piece of solid thermal insulator 328 (not shown). The solid thermal insulator 328 is therefore disposed between a bottom interior surface of the receiver structure 314 and a bottom exterior surface of the mount structure 320.

It is noted that various optical, electronic and thermal components of the camera module 202 are disposed closely to each other and can be accommodated within the housing 302 that has a compact form factor. Although an electronic assembly of the camera module 202 could be substantially sensitive to a temperature increase (e.g., oversee unacceptable performance degradation when the temperature increases beyond 75° C.), thermally conductive components could be arranged to surround the heat-sensitive electronic assembly and a heat generating electronic assembly separately, thereby creating heat conduction paths to direct heat away from the heat-sensitive electronic assembly and to the housing 302. In some implementations, a substantial portion of the heat generated by the electronic assemblies of the camera module 202 is directed to the housing 302 via the heat conduction paths 402-410 at a fast rate, such that the temperature increase of the image sensor assembly 306 is controlled under a predetermined tolerance (e.g., 25° C.).

Figure 5B:
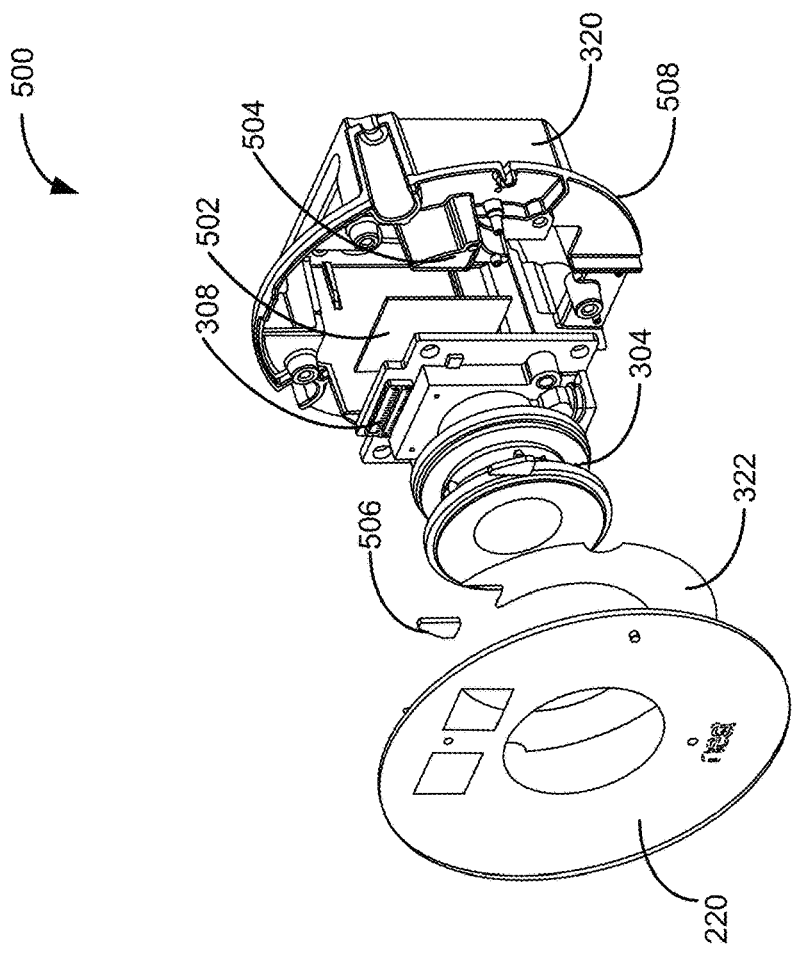
FIG. 5B is an exploded view of the front portion of the camera module shown in FIG. 5A in accordance with some implementations.
Figure 5A:
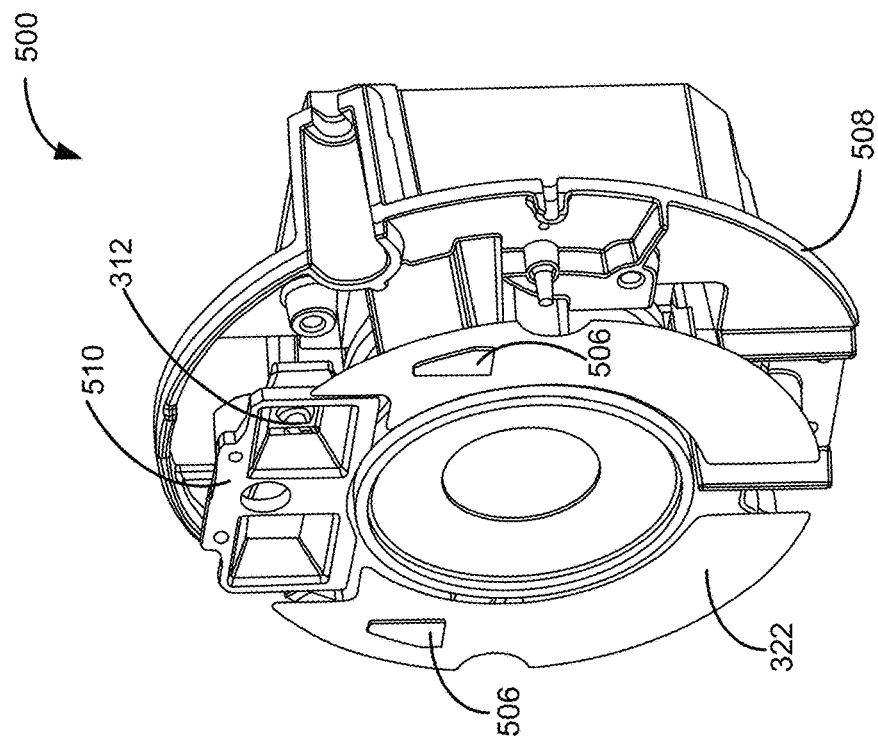
FIG. 5A is a front portion of a camera module that is configured to conduct heat of an image sensor assembly in accordance with some implementations.

FIG. 5A is a front portion 500 of a camera module 202 that is configured to conduct heat of an image sensor assembly in accordance with some implementations, and FIG. 5B is an exploded view of the front portion 500 of the camera module 202 shown in FIG. 5A in accordance with some implementations. In this front portion 500 of the camera module 202, an image sensor assembly 306 and a lens assembly 304 are enclosed within a mount structure 320 by a cover glass 220. The lens assembly 304 is aligned with the image sensor assembly 306 and configured to direct incident light thereto. The image sensor assembly 320 is fixed onto a front-facing interior surface of the mount structure 320, and sits on a thermal pad 502 that conducts heat from the image sensor assembly 306 to the mount structure 320. A front thermal dissipater 322 is attached to a front interior surface of the housing 302 (e.g., a rear surface of the cover glass 220), and opposes the front-facing interior surface of the mount structure 320. Optionally, the mount structure 320 includes one or more protrusions 504. The one or more protrusions 504 are thermally coupled to the front thermal dissipater 322 via one or more thermal pads 506, thereby passing the heat absorbed from the image sensor assembly 306 to the front heat dissipater 322 and the cover glass 220. In some implementations, an edge 508 of the mount structure 320 is thermally coupled to an interior surface of the housing 302 to dissipate part of the heat absorbed from the image sensor assembly 306 to the housing 302 directly without passing through the front thermal dissipater 322 (e.g., along the heat conduction path 410 shown in FIG. 4).

The thermal pad 502 is configured to couple the image sensor assembly 306 and the mount structure 320, and conduct the heat generated by the image sensor assembly 306 to the mount structure 320 at a substantially fast rate. By these means, the heat generated by the image sensor assembly 306 does not cause hot regions locally on the image sensor assembly 306 or comprise its performance for capturing optical signals and pre-processing image data associated with the captured optical signals. The thermal pad 502 is made of a thermally conductive material having a substantially high thermal conductivity and a substantially low thermal resistance. In an example, the thermal pad 502 includes thermal gel having a thermal conductivity greater than 1 W/(m·K), e.g., a thermal conductivity of 3.5 W/(m·K).

The front thermal dissipater 322 is configured to spread the heat absorbed from the mount structure 320 over a substantially large area of the cover glass 220 (e.g., 80% of the entire area of the cover glass 220), thereby taking better advantage of the area of the cover glass 220 for dissipating the heat to the ambient from a front of the housing 302. In some implementations, the front thermal dissipater 322 overlaps with an entire front interior surface of the housing 302 except for leaving an opening at its center for exposing the lens assembly 304 to incident light (e.g., incoming visible or infrared light). For these reasons, the front thermal dissipater 322 is made of a thermally conductive material having a substantially high thermal conductivity and a substantially low thermal resistance. An example front thermal dissipater 322 is made of graphite having a thermal conductivity greater than 100 W/(m·K), e.g., a thermal conductivity of 1200 W/(m·K), and a thickness of 0.04 mm.

Further, in some implementations, the front portion 500 of the camera module 202 includes a set of IR illuminators 312 that is placed within an IR illuminator assembly 510. The IR illuminator assembly 510 faces towards the front of the camera module 202, and is configured to support the IR illuminators 312 and modulate a field of view of the camera module 202 illuminated by the IR illuminators 332. Specifically, the IR illuminator assembly 510 is disposed close to an edge of the cover glass 220 without interfering light incident on the lens assembly 304 and the image sensor assembly 306. In some implementations, the front thermal dissipater 322 is shaped (e.g., has an opening) to expose the set of IR illuminators 312 to the front of the camera module 202.

The thermal pads 506 couple the mount structure 320 and the front heat dissipater 322, and are configured to conduct the heat absorbed by the mount structure 320 to the front heat dissipater 322 and the cover glass 220, such that the cover glass 220 could dissipate the heat to the ambient from the front side of the housing 302. The thermal pads 506 are made of a thermally conductive material having a substantially high thermal conductivity (e.g., 1-10 W/(m·K)) and a substantially low thermal resistance. In some implementations, the thermal pads 506 compensates thermal stresses and mismatches that incur to the front thermal dissipater 322 and the mount structure 320 due to a temperature increase. The thermal pads 506 function as an interface that tolerates compression beyond a portion of its original thickness (e.g., ≥50% of its original thickness), thereby controlling pressures on the front thermal dissipater 322, the cover glass 220 and the mount structure 320. Example thermal pads 506 have a thermal conductivity greater than 1 W/(m·K), e.g., a thermal conductivity of 3 W/(m·K), and a thickness of 1.02 mm.

FIGS. 6A-6E illustrate an example assembly process 600 for integrating an image sensor assembly 306 in a front portion 500 of a camera module 202 in accordance with some implementations. The thermal pad 502 is disposed (602) on a front-facing interior surface of the mount structure 320. The image sensor assembly 306 is mounted (604) on top of the front-facing interior surface of the mount structure 320 via the thermal pad 502, and the lens assembly 304 is disposed in the mount structure 320 in alignment with the image sensor assembly 306. In some implementations, the thermal pad 502 is made of a thermally conductive material (e.g., thermal gel) that thermally couples the image sensor assembly 306 and the mount structure 320 while mechanically holding the image sensor assembly 306 onto the mount structure 320. Further, in some implementations, the mount structure 320 includes one or more protrusions 504. One or more thermal pads 506 are disposed (606) on the one or more protrusions 502. Then, the front thermal dissipater 322 comes into contact (608) with the mount structure 320 via the one or more thermal pads 506, thereby being thermally coupled to the mount structure 320 via the one or more thermal pads 506. The cover glass 220 is attached (610) onto the front thermal dissipater 322, leaving a transparent opening to expose the lens assembly to incoming light.

Figure 7:
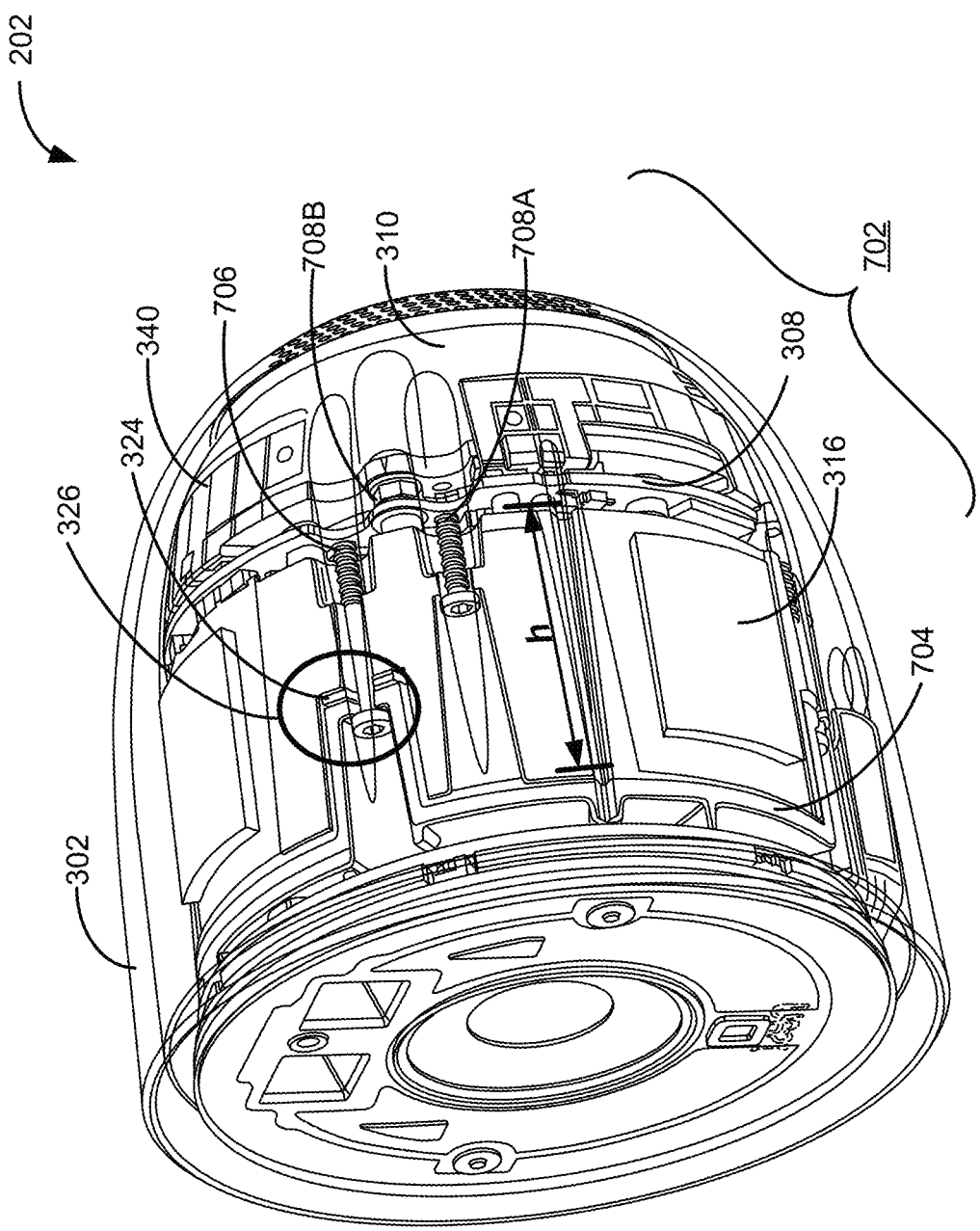
FIG. 7 is another perspective view of an example camera module having a front portion and a rear portion disposed proximately to each other in accordance with some implementations.
Figure 8:
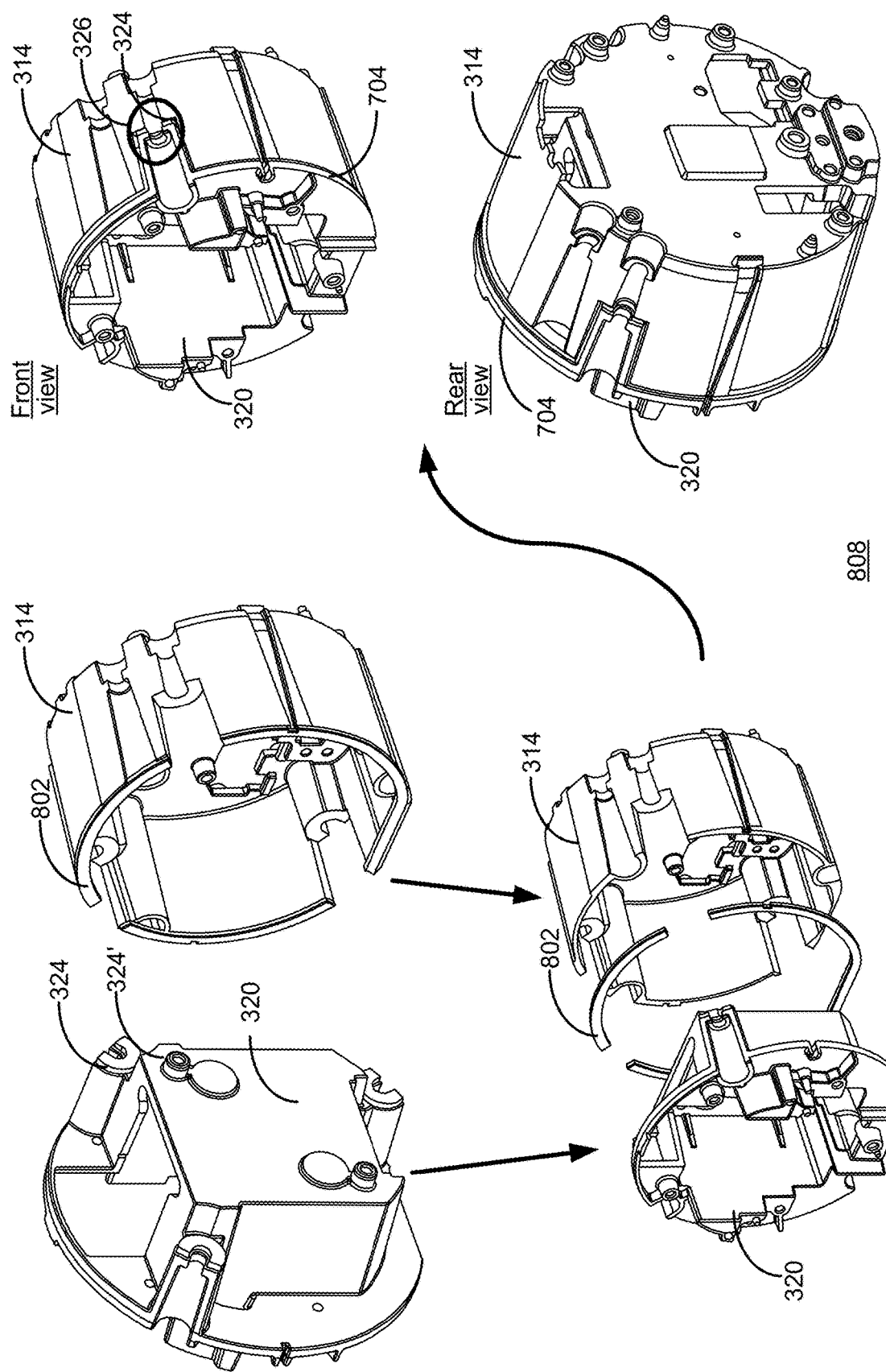
FIG. 8 illustrates an example assembly process for mechanically integrating a mount structure of a front portion of the camera module and a receiver structure of a rear portion of the camera module in accordance with some implementations.

FIG. 7 is another perspective view of an example camera module 202 having a front portion 500 and a rear portion 702 disposed proximately to each other in accordance with some implementations. FIG. 8 illustrates an example assembly process 800 for mechanically integrating a mount structure 320 of a front portion 500 of the camera module 202 and a receiver structure 314 of a rear portion 702 of the camera module 202 in accordance with some implementations. Referring to FIG. 7, the front portion 500 is enclosed between the mount structure 320 and a cover glass 220 (which is regarded as part of the housing 302 in this application). The lens assembly 304 in the front portion 500 of the camera module 202 is visible from the cover glass 220, and is configured to receive incident light (e.g., incoming visible or infrared light) through the cover glass 220.

Referring to FIG. 8, in some implementations, the mount structure 320 and the receiver structure 314 have respective shapes that match with each other, such that the mount structure 320 can substantially sit within the receiver structure 314. For example, the mount structure 320 has a shape of a fryer basket, and the receiver structure 314 has a shape of a fryer pot configured for receiving the fryer basket. An edge 704 of the mount structure 320 extends above and is not enclosed within the receiver structure 314. Optionally, the edge 704 of the mount structure 320 comes into contact with an interior surface of the housing 302, and dissipates part of heat absorbed by the mount structure 320 to the housing 302.

In some implementations, the edge 704 of the mount structure 320 is fixed to an edge of the receiver structure 314, but separated from the edge of the receiver structure 314 at one or more separation spots 326. Specifically, the edge 704 of the mount structure 320 is mechanically fixed onto the edge of the receiver structure 314 at the one or more separation spots using fasteners (e.g., a screw 706), while a respective insulator pad 324 is placed at each of the one or more separation spots 326 to thermally insulate the mount structure 320 and the receiver structure 314. In some implementations, referring to FIG. 8, the one or more separation spots 326 are equally distributed on the respective edge of each of the receiver structure 314 and the mount structure 320. In some implementations, alternative separation spots are located between a bottom interior surface of the receiver structure 314 and a bottom exterior surface of the mount structure 320. Optionally, the mount structure 320 is mechanically fixed onto the receiver structure 314 at the alternative separation spots using fasteners, while a respective insulator pad 324' is placed at each of the alternative separation spots to thermally insulate the mount structure 320 and the receiver structure 314.

Further, in some implementations, a solid thermal insulator 328 is disposed between the bottom interior surface of the receiver structure 314 and the bottom exterior surface of the mount structure 320 to thermally insulate the mount structure 320 and the receiver structure 314. Additionally, in some implementations, one or more thermal insulators 802 are disposed between the edge 704 of the mount structure 320 and the edge of the receiver structure 314 to thermally insulate the mount structure 320 and the receiver structure 314.

In some implementations, the receiver structure 314 has a height h that covers a substantial portion (e.g., greater than 60%) of the interior surface of the housing 302. The receiver structure 314 could contain the mount structure 320 to maintain a substantially compact form factor, and provide a sufficiently large area for dissipating heat absorbed by the receiver structure 314 to the interior surface of the housing 302. Additionally, in some implementations, one or more thermal pads 316 are applied to thermally couple a peripheral exterior surface of the receiver structure 314 to the interior surface of the housing 302. The thermal pads 316 are made of a thermally conductive material having a substantially high thermal conductivity and a substantially low thermal resistance. In an example, the thermal pads 316 have a thermal conductivity greater than 1 W/(m·K), e.g., a thermal conductivity of 2.8 W/(m·K), and a thickness of 1.70 mm.

The rear portion 702 of the camera module 202 further includes a heat generating electronic assembly 308 (e.g., an SOC assembly). The receiver structure 314 is disposed proximately to a first surface of the heat generating electronic assembly 308 to absorb heat generated by the electronic assembly 308 from its first surface and direct the heat to the interior surface of the housing 302. In some implementations, the heat generating electronic assembly 308 includes a second surface opposing the first surface, and generates heat from the second surface as well. A heat sink (e.g., a speaker box 310) is disposed between the second surface of the heat generating electronic assembly 308 and the interior surface of the housing 302. The heat sink is configured to absorb and conduct part of heat generated by the SOC assembly 308. Optionally, two of the receiver structure 314, the heat generating electronic assembly 308 and the heat sink 310 are coupled to each other using one or more fasteners (e.g., screws 708A and 708B). More details on the heat sink configured from the speaker box 310 of the camera module 202 are explained below with reference to FIGS. 10A and 10B.

Figure 9:
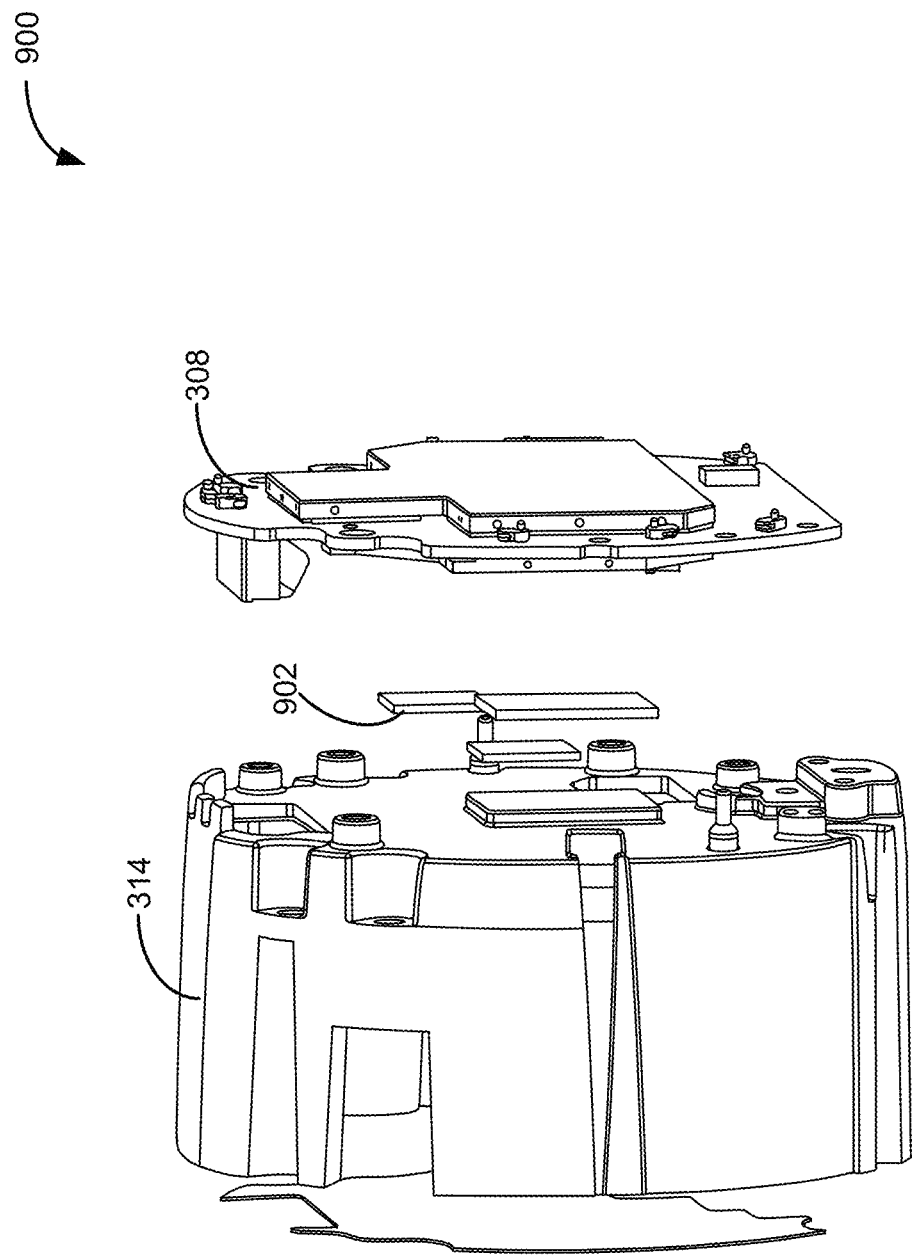
FIG. 9 is part of a rear portion of a camera module shown in an exploded manner in accordance with some implementations.

FIG. 9 is part of a rear portion 900 of a camera module 202 shown in an exploded manner in accordance with some implementations. In the rear portion 702, a bottom exterior surface of a receiver structure 314 is disposed proximately to a first surface of a heat generating electronic assembly (e.g., an SOC assembly 308) to absorb heat generated by the electronic assembly from its first surface. Specifically, the SOC assembly 308 is configured to provide a subset of power management circuit, communication interfaces, one or more processors, and memory to enable data processing and communication of the camera module 202. In some implementations, the bottom exterior surface of the receiver structure 314 is coupled to the first surface of the SOC assembly 308 via one or more thermal pads 902. The one or more thermal pads 902 are optionally disposed on one or more hot spots of the SOC assembly 308 (e.g., where the CPU is located) to absorb heat from the one or more hot spots and conduct the heat to the receiver structure 314. The thermal pads 902 are made of a thermally conductive material having a substantially high thermal conductivity and a substantially low thermal resistance. In an example, the thermal pads 902 have a thermal conductivity greater than 1 W/(m·K), e.g., a thermal conductivity of 3 W/(m·K), and a thickness of 0.75 mm. In some implementations, the thermal pads 902 are made from a soft silicone based thermally conductive gap filler that has desirable thermal and compression characteristics. In an example, a CPU is integrated on the second surface of the SOC assembly, the heat generated by the CPU is conducted to the receiver structure 314, dissipated to the ambient from a peripheral side of the camera module 202.

Figure 10B:
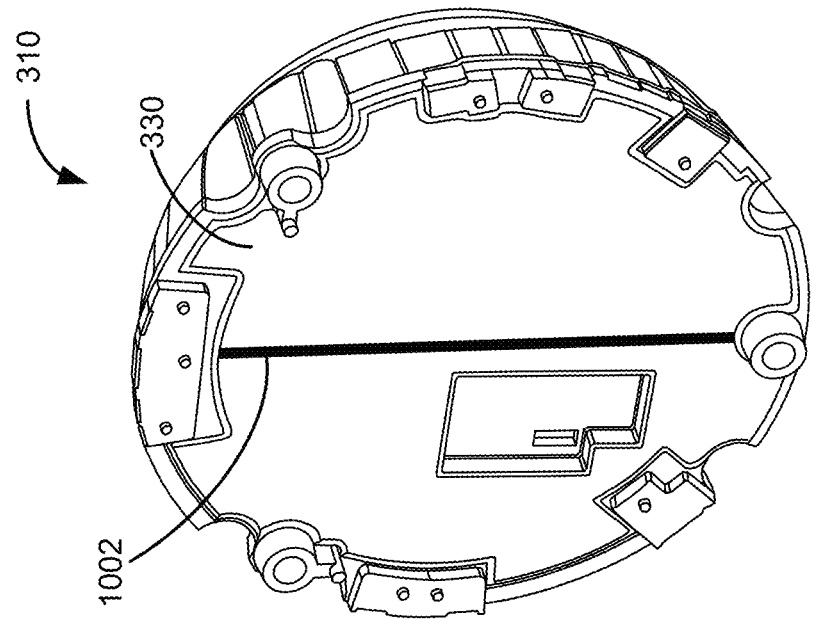
FIG. 10B is a speaker box that is covered by a thermally conductive sheet 330 and functions as a heat sink for the rear portion of the camera module in accordance with some implementations.
Figure 10A:
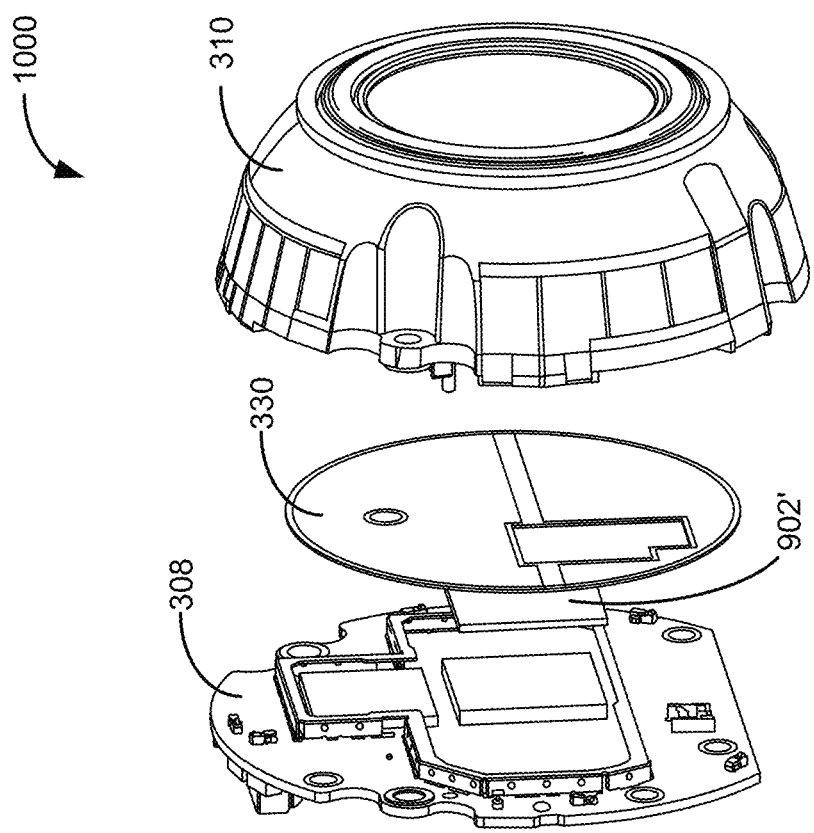
FIG. 10A is part of a rear portion of a camera module shown in an exploded manner in accordance with some implementations.

FIG. 10A is part of a rear portion 1000 of a camera module 202 shown in an exploded manner in accordance with some implementations, and FIG. 10B is a speaker box 310 that is covered by a thermally conductive sheet 330 and functions as a heat sink for the rear portion 702 of the camera module 202 in accordance with some implementations. The speaker box 310 is at least partially made of thermal plastics having a substantially high thermal conductivity and a substantially low thermal resistance. One or more thermal pads 902' are optionally disposed on one or more hot spots of the SOC assembly 308 to absorb heat from one or more hot spots, and conduct the heat to the speaker box 310. The thermal pads 902' are made of a thermally conductive material having a substantially high thermal conductivity and a substantially low thermal resistance. In an example, the thermal pads 902' have a thermal conductivity greater than 1 W/(m·K), e.g., a thermal conductivity of 5 W/(m·K), and a thickness of 1 mm. In some implementations, the thermal pads 902 is made from a soft silicone based thermally conductive gap filler that has desirable thermal and compression characteristics. It is noted that the thermal pads 902 or 902' optionally include thermal gel that coats one or more hot spots on the first or second surface of the SOC assembly 314.

In some implementations, a thermally conductive sheet 330 is attached to a front surface of the speaker box 310. The thermally conductive sheet 330 is configured to spread the heat absorbed from the SOC assembly 314 over a substantially large area of the front surface of the speaker box 310 (e.g., >80% of the front surface), thereby taking advantage of the area of the speaker box 310 to dissipate the heat to the ambient from a rear side of the housing 302. The thermally conductive sheet 330 is made of a thermally conductive material having a substantially high thermal conductivity (e.g., 1-1000 W/(m·K)) and a substantially low thermal resistance. An example thermally conductive sheet 330 is made of graphite having a thermal conductivity of 600 W/(m·K) and a thickness of 0.127 mm. In another example, the CPU is integrated on the second surface of the SOC assembly, the heat generated by the CPU is conducted to the speaker box 310 via the thermally conductive sheet 330, dissipated to the ambient from the rear side of the camera module 202.

In some implementations, referring to FIGS. 3A-3B and 7, one or more antennas 340 are attached to an exterior surface of the speaker box 314 and contained within the housing 302. The thermally conductive sheet 330 includes a cut 1002 substantially near a center of the thermally conductive sheet 330, and the cut has a width that is less than a threshold cut width thereby reducing crosstalk among the one or more antennas 340 below a threshold crosstalk level (e.g., to achieve ≥10 dB isolation). In some implementations, the one or more antennas 340 includes a first number of antennas. The thermally conductive sheet 330 includes a second number of cuts arranged according to locations of the one or more antennas 340. The first number is optionally greater than the second number. In some implementations, the first number is greater than the second number by 1.

In an example, the thermally conductive sheet 330 is made of graphite that is both thermally and electrically conductive. When the thermally conductive sheet 330 made of graphite is placed on the front surface of the speaker box 310 (i.e., near the one or more antennas 340), it can create a coupling medium and degrade isolation among the one or more antennas 340, thereby compromising antenna efficiency and potentially damaging communication circuitry in the SOC assembly 308. In some implementations, the thermally conductive sheet 330 made of graphite is placed on top of a shield can (a speaker box 310 that is properly shielded under the thermally conductive sheet 330). Any coupling current flowing on the thermally conductive sheet 330 made of graphite is cancelled with its image current formed on the other side of the shield can. The thermally conductive sheet 330 made of graphite therefore does not have any impact on the one or more antennas 340. Alternatively, the one or more antennas 340 have a first spatial distance between each antenna and a second spatial distance from each of the one or more antennas 340. Each of the first and second spatial distances is controlled beyond a respective spatial threshold to protect an antenna 340 from cross coupling with another antenna 340 and with the thermally conductive sheet 330 made of graphite.

In accordance with some implementations of this application, a small cut is created near the center of the thermally conductive sheet 330 made of graphite, separating the thermally conductive sheet 330 into two pieces. The location of the cut is chosen so each piece of the thermally conductive sheet 330 can still make contact to the thermal pads 902'. The width of the cut is controlled to increase both a surface area of the thermally conductive sheet 330 and a contact area between the thermally conductive sheet 330 and the thermal pads 902'. The cut essentially break a coupling channel among the one or more antennas 340, thus increasing the isolation among them and restoring efficiency for each antenna. In an example, the cut is located in the middle of the thermally conductive sheet 330, and a temperature increase of 1.6° C. is measured on the thermally conductive sheet 330. Despite the cut, the heat absorbed from the second surface of the SOC assembly 314 is substantially evenly distributed to the entire thermally conductive sheet 330.

Each of the first plurality of thermally conductive parts and the second plurality of thermally conductive parts has a substantially high thermal conductivity. Stated another way, the substantially high thermal conductivity of each thermally conductive part is greater than a respective thermal conductivity threshold (e.g., 1 W/(m·K) and 100 W/(m·K)). Examples are provided for some of the thermally conductive parts, and the specific thermal conductivities and thicknesses in the examples of the thermally conductive parts are not intended to limit the specific thermal conductivities and thicknesses to the given examples. For example, the thermal pads 316 have a thermal conductivity of 2.8 W/(m·K), and a thickness of 1.70 mm. The thermal pads 316 may still have a thermal conductivity of 1.5 W/(m·K), 3 W/(m·K), 4 W/(m·K), 5 W/(m·K), 100 W/(m·K), or anywhere in between, and the thickness may be 1.4 mm, 1.5 mm, 2.0 mm, etc.

It will be understood that, although the terms first, second, etc. are, in some instances, used herein to describe various elements, these elements should not be limited by these terms. These terms are only used to distinguish one element from another. For example, a first surface can be termed a second surface, and, similarly, a second surface can be termed a first surface, without departing from the scope of the various described implementations. The first surface and the second surface are both surfaces, but they are not the same surface.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, components, structures and/or groups, but do not preclude the presence or addition of one or more other features, integers, steps, operations, elements, components, structures, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

It is to be appreciated that "smart home environments" may refer to smart environments for homes such as a single-family house, but the scope of the present teachings is not so limited. The present teachings are also applicable, without limitation, to duplexes, townhomes, multi-unit apartment buildings, hotels, retail stores, office buildings, industrial buildings, and more generally any living space or work space.

It is noted that the assemblies described herein are exemplary and are not intended to be limiting. For example, any dimensions, shapes, styles, and/or materials described herein are exemplary and are not intended to be limiting. Drawings are not to scale. For brevity, features or characters described in association with some implementations may not necessarily be repeated or reiterated when describing other implementations. Even though it may not be explicitly described therein, a feature or characteristic described in association with some implementations may be used by other implementations.

What is claimed is:

1. An electronic device, comprising:
   a first electronic assembly;
   a second electronic assembly;
   a first structure thermally coupled to the first electronic assembly, the first structure configured to create a first plurality of heat conduction paths to conduct heat generated by the first electronic assembly away from the second electronic assembly without using a fan; and
   a second structure thermally coupled to the second electronic assembly, the second structure disposed at least partially within a recess created by the first structure and configured to mechanically support the second electronic assembly within the first structure.

2. The electronic device of claim 1, wherein the first and second electronic assemblies are disposed proximately to each other within a housing of the electronic device, and the second electronic assembly is substantially sensitive to heat, including the heat generated by the first electronic assembly.

3. The electronic device of claim 1, wherein at least a portion of the first structure mechanically supports one or both of the first and second electronic assemblies.

4. The electronic device of claim 1, wherein:
   the first structure includes a receiver structure disposed on a first surface of the first electronic assembly; and
   the second structure includes a mount structure configured to fit into the receiver structure and support the second electronic assembly on a front-facing interior surface of the mount structure.

5. The electronic device of claim 4, wherein the receiver and mount structures are separated by one or more separation spots that are equally distributed on a respective edge of each of the receiver structure and the mount structure.

6. The electronic device of claim 5, wherein:
   the receiver structure is configured to absorb a first part of the heat generated by the first electronic assembly; and
   the mount structure is configured to create a second plurality of heat conduction paths to conduct heat from the second electronic assembly to a housing of the electronic device without using the fan, the mount structure contacts the receiver structure via the one or more separation spots that thermally separate the receiver structure and the mount structure.

7. The electronic device of claim 6, further comprising:
   one or more second thermal pads configured to physically and thermally couple a peripheral exterior surface of the receiver structure to an interior surface of the housing, the one or more second thermal pads being configured to conduct the first part of the heat generated by the first electronic assembly from the receiver structure to the housing of the electronic device in accordance with a first heat conduction path of the first plurality of heat conduction paths.

8. The electronic device of claim 7, wherein:
   the first structure includes a speaker box thermally coupled to a second surface of the first electronic assembly via a thermally conductive sheet; and
   the speaker box is configured to absorb and conduct a second part of the heat generated by the first electronic assembly in accordance with a second heat conduction path of the first plurality of heat conduction paths.

9. The electronic device of claim 8, wherein at least part of the speaker box is made of a thermal plastic material configured to absorb and conduct the second part of the heat generated by the first electronic assembly.

10. The electronic device of claim 8, wherein:
    one or more antennas are attached to an exterior surface of the speaker box and contained within the housing;
    the thermally conductive sheet includes a cut substantially near a center of the thermally conductive sheet; and
    the cut has a width that is less than a threshold cut width thereby reducing crosstalk among the one or more antennas below a threshold crosstalk level.

11. The electronic device of claim 4, wherein a bottom exterior surface of the mount structure is separated from a bottom interior surface of the receiver structure by an air gap.

12. The electronic device of claim 4, wherein a bottom exterior surface of the mount structure is separated from a bottom interior surface of the receiver structure by a piece of solid thermal insulator.

13. The electronic device of claim 4, wherein a bottom exterior surface of the receiver structure is coupled to the first surface of the first electronic assembly via one or more first thermal pads that are disposed on one or more hot spots of the first electronic assembly.

14. The electronic device of claim 1, wherein the first electronic assembly is configured to provide one or more processors and memory of the electronic device, and the second electronic assembly includes at least one of an image sensor array and a graphics processing unit.

15. The electronic device of claim 1, further comprising a lens assembly disposed on the second structure, wherein:
the second electronic assembly includes an image sensor array; and
the lens assembly is at least partially disposed in the recess created by the first structure in alignment with the image sensor array.

16. The electronic device of claim 1, wherein:
the first structure includes a speaker box; and
the first electronic assembly is disposed between the speaker box and the second structure.

17. The electronic device of claim 1, wherein the second structure includes a mount structure configured to support the second electronic assembly when a first surface of the second electronic assembly sits on a front-facing interior surface of the mount structure.

18. The electronic device of claim 17, wherein:
the mount structure is configured to create a second plurality of heat conduction paths to conduct heat from the second electronic assembly to a housing of the electronic device without using a fan;
the mount structure is configured to at least partially absorb and conduct heat generated by the second electronic assembly in accordance with a heat conduction path of the second plurality of heat conduction paths;
the second structure further includes a front thermal dissipater attached on a front interior surface of the housing and opposite the front-facing interior surface of the mount structure;
the mount structure is thermally coupled to the front thermal dissipater via one or more thermal pads; and
the front thermal dissipater is configured to at least partially absorb and conduct the heat generated by the second electronic assembly in accordance with a second heat conduction path of the second plurality of heat conduction paths.

19. The electronic device of claim 18, wherein a front portion of the housing is covered by a cover glass, and the front thermal dissipater is attached to the cover glass.

20. The electronic device of claim 18, wherein the mount structure is:
disposed in contact with the front thermal dissipater; and
thermally coupled to the front thermal dissipater.

* * * * *